(12) United States Patent
Hashido et al.

(10) Patent No.: US 7,394,419 B2
(45) Date of Patent: Jul. 1, 2008

(54) DECODING CIRCUIT FOR DECODING MULTIBIT DATA, AND A DISPLAY APPARATUS UTILIZING THE SAME

(75) Inventors: Ryuichi Hashido, Chiyoda-ku (JP); Masafumi Agari, Chiyoda-ku (JP); Hiroyuki Murai, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/696,891

(22) Filed: Apr. 5, 2007

(65) Prior Publication Data

US 2007/0237407 A1  Oct. 11, 2007

(30) Foreign Application Priority Data

Apr. 6, 2006  (JP) .............................. 2006-105279

(51) Int. Cl.
*H03M 1/76* (2006.01)
(52) U.S. Cl. ....................... 341/148; 341/144
(58) Field of Classification Search .......... 341/140–165
See application file for complete search history.

(56) References Cited

U.S. PATENT DOCUMENTS

| | | | | |
|---|---|---|---|---|
| 4,295,051 A | * | 10/1981 | Graf et al. .................. | 250/569 |
| 4,387,597 A | * | 6/1983 | Brandestini .................. | 73/626 |
| 4,935,736 A | * | 6/1990 | Meierdierck ................ | 341/176 |
| 4,962,527 A | * | 10/1990 | Burns et al. ................. | 379/418 |
| 6,900,752 B2 | * | 5/2005 | Oda et al. .................... | 341/154 |
| 7,209,057 B2 | * | 4/2007 | Hashido et al. .............. | 341/56 |
| 2006/0232450 A1 | | 10/2006 | Hashido et al. | |

FOREIGN PATENT DOCUMENTS

| | | |
|---|---|---|
| JP | 2001-133754 | 5/2001 |
| JP | 2003-29687 | 1/2003 |
| JP | 2003-241716 | 8/2003 |
| JP | 2005-283777 | 10/2005 |

* cited by examiner

*Primary Examiner*—Lam T Mai
(74) *Attorney, Agent, or Firm*—Oblon, Spivak, McClelland, Maier & Neustadt, P.C.

(57) ABSTRACT

In each of sub-decoding circuits at a first stage provided for a plurality of output candidates arranged adjacently, for selecting corresponding output candidates in accordance with a bit of multibit data for transmission to subsequent stage sub-decoding circuits, unit decoders are arranged in parallel in a direction perpendicular to an arranging direction of the output candidates. A size in a vertical direction along which reference voltages of the output candidates of a decoding circuit are arranged can be reduced without increasing a size in a horizontal direction.

12 Claims, 24 Drawing Sheets

| V | D0 (LSB) | D1 | D2 (USD3) | D3 | D4 | D5 (MSB) | |
|---|---|---|---|---|---|---|---|
| 63 | H | ↓ | ↓ | ↓ | ↓ | ↓ | ← FSD31 |
| 62 | L | H | H | ↓ | ↓ | ↓ | ← SSD7 |
| 61 | H | ↓ | ↓ | ↓ | ↓ | ↓ | |
| 60 | L | L | H | ↓ | ↓ | ↓ | |
| 59 | H | ↓ | ↓ | ↓ | ↓ | ↓ | |
| 58 | L | H | L | ↓ | ↓ | ↓ | |
| 57 | H | ↓ | ↓ | ↓ | ↓ | ↓ | |
| 56 | L | L | L | H | H | H | ← LSD7 |
| 55 | H | ↓ | ↓ | ↓ | ↓ | ↓ | |
| 54 | L | H | H | ↓ | ↓ | ↓ | |
| 53 | H | ↓ | ↓ | ↓ | ↓ | ↓ | |
| 52 | L | L | H | ↓ | ↓ | ↓ | |
| 51 | H | ↓ | ↓ | ↓ | ↓ | ↓ | |
| 50 | L | H | L | ↓ | ↓ | ↓ | |
| 49 | H | ↓ | ↓ | ↓ | ↓ | ↓ | |
| 48 | L | L | L | L | H | H | ← LSD6 |
| 47 | H | ↓ | ↓ | ↓ | ↓ | ↓ | |
| 46 | L | H | H | ↓ | ↓ | ↓ | |
| 45 | H | ↓ | ↓ | ↓ | ↓ | ↓ | |
| 44 | L | L | H | ↓ | ↓ | ↓ | |
| 43 | H | ↓ | ↓ | ↓ | ↓ | ↓ | |
| 42 | L | H | L | ↓ | ↓ | ↓ | |
| 41 | H | ↓ | ↓ | ↓ | ↓ | ↓ | |
| 40 | L | L | L | H | L | H | ← LSD5 |
| 39 | H | ↓ | ↓ | ↓ | ↓ | ↓ | |
| 38 | L | H | H | ↓ | ↓ | ↓ | |
| 37 | H | ↓ | ↓ | ↓ | ↓ | ↓ | |
| 36 | L | L | H | ↓ | ↓ | ↓ | |
| 35 | H | ↓ | ↓ | ↓ | ↓ | ↓ | |
| 34 | L | H | L | ↓ | ↓ | ↓ | |
| 33 | H | ↓ | ↓ | ↓ | ↓ | ↓ | |
| 32 | L | L | L | L | L | H | ← LSD4 |
| 31 | H | ↓ | ↓ | ↓ | ↓ | ↓ | |
| 30 | L | H | H | ↓ | ↓ | ↓ | |
| 29 | H | ↓ | ↓ | ↓ | ↓ | ↓ | |
| 28 | L | L | H | ↓ | ↓ | ↓ | |
| 27 | H | ↓ | ↓ | ↓ | ↓ | ↓ | |
| 26 | L | H | L | ↓ | ↓ | ↓ | |
| 25 | H | ↓ | ↓ | ↓ | ↓ | ↓ | |
| 24 | L | L | L | H | H | L | ← LSD3 |
| 23 | H | ↓ | ↓ | ↓ | ↓ | ↓ | |
| 22 | L | H | H | ↓ | ↓ | ↓ | |
| 21 | H | ↓ | ↓ | ↓ | ↓ | ↓ | |
| 20 | L | L | H | ↓ | ↓ | ↓ | |
| 19 | H | ↓ | ↓ | ↓ | ↓ | ↓ | |
| 18 | L | H | L | ↓ | ↓ | ↓ | |
| 17 | H | ↓ | ↓ | ↓ | ↓ | ↓ | |
| 16 | L | L | L | L | H | L | ← LSD2 |
| 15 | H | ↓ | ↓ | ↓ | ↓ | ↓ | |
| 14 | L | H | H | ↓ | ↓ | ↓ | |
| 13 | H | ↓ | ↓ | ↓ | ↓ | ↓ | |
| 12 | L | L | H | ↓ | ↓ | ↓ | |
| 11 | H | ↓ | ↓ | ↓ | ↓ | ↓ | |
| 10 | L | H | L | ↓ | ↓ | ↓ | |
| 9 | H | ↓ | ↓ | ↓ | ↓ | ↓ | |
| 8 | L | L | L | H | L | L | ← LSD1 |
| 7 | H | ↓ | ↓ | ↓ | ↓ | ↓ | |
| 6 | L | H | H | ↓ | ↓ | ↓ | |
| 5 | H | ↓ | ↓ | ↓ | ↓ | ↓ | |
| 4 | L | L | H | ↓ | ↓ | ↓ | |
| 3 | H | ↓ | ↓ | ↓ | ↓ | ↓ | |
| 2 | L | H | L | ↓ | ↓ | ↓ | |
| 1 | H | ↓ | ↓ | ↓ | ↓ | ↓ | |
| 0 | L | L | L | L | L | L | ← LSD0 |

FIG.18

LOWER-ORDER 5 BITS: SAME PATTERN

| V | D5 (MSB) | D0 (LSB) | D1 | D2 | D3 | D4 |
|---|---|---|---|---|---|---|
| 63 | H | ↓ | ↓ | ↓ | ↓ | ↓ |
| 31 | L | H | H | ↓ | ↓ | ↓ |
| 62 | H | ↓ | ↓ | ↓ | ↓ | ↓ |
| 30 | L | L | H | ↓ | ↓ | ↓ |
| 61 | H | ↓ | ↓ | ↓ | ↓ | ↓ |
| 29 | L | H | L | ↓ | ↓ | ↓ |
| 60 | H | ↓ | ↓ | ↓ | ↓ | ↓ |
| 28 | L | L | L | H | H | H |
| 59 | H | ↓ | ↓ | ↓ | ↓ | ↓ |
| 27 | L | H | H | ↓ | ↓ | ↓ |
| 58 | H | ↓ | ↓ | ↓ | ↓ | ↓ |
| 26 | L | L | H | ↓ | ↓ | ↓ |
| 57 | H | ↓ | ↓ | ↓ | ↓ | ↓ |
| 25 | L | H | L | ↓ | ↓ | ↓ |
| 56 | H | ↓ | ↓ | ↓ | ↓ | ↓ |
| 24 | L | L | L | L | H | H |
| 55 | H | ↓ | ↓ | ↓ | ↓ | ↓ |
| 23 | L | H | H | ↓ | ↓ | ↓ |
| 54 | H | ↓ | ↓ | ↓ | ↓ | ↓ |
| 22 | L | L | H | ↓ | ↓ | ↓ |
| 53 | H | ↓ | ↓ | ↓ | ↓ | ↓ |
| 21 | L | H | L | ↓ | ↓ | ↓ |
| 52 | H | ↓ | ↓ | ↓ | ↓ | ↓ |
| 20 | L | L | L | H | L | H |
| 51 | H | ↓ | ↓ | ↓ | ↓ | ↓ |
| 19 | L | H | H | ↓ | ↓ | ↓ |
| 50 | H | ↓ | ↓ | ↓ | ↓ | ↓ |
| 18 | L | L | H | ↓ | ↓ | ↓ |
| 49 | H | ↓ | ↓ | ↓ | ↓ | ↓ |
| 17 | L | H | L | ↓ | ↓ | ↓ |
| 48 | H | ↓ | ↓ | ↓ | ↓ | ↓ |
| 16 | L | L | L | L | L | H |
| 47 | H | ↓ | ↓ | ↓ | ↓ | ↓ |
| 15 | L | H | H | ↓ | ↓ | ↓ |
| 46 | H | ↓ | ↓ | ↓ | ↓ | ↓ |
| 14 | L | L | H | ↓ | ↓ | ↓ |
| 45 | H | ↓ | ↓ | ↓ | ↓ | ↓ |
| 13 | L | H | L | ↓ | ↓ | ↓ |
| 44 | H | ↓ | ↓ | ↓ | ↓ | ↓ |
| 12 | L | L | L | H | H | L |
| 43 | H | ↓ | ↓ | ↓ | ↓ | ↓ |
| 11 | L | H | H | ↓ | ↓ | ↓ |
| 42 | H | ↓ | ↓ | ↓ | ↓ | ↓ |
| 10 | L | L | H | ↓ | ↓ | ↓ |
| 41 | H | ↓ | ↓ | ↓ | ↓ | ↓ |
| 9 | L | H | L | ↓ | ↓ | ↓ |
| 40 | H | ↓ | ↓ | ↓ | ↓ | ↓ |
| 8 | L | L | L | L | H | L |
| 39 | H | ↓ | ↓ | ↓ | ↓ | ↓ |
| 7 | L | H | H | ↓ | ↓ | ↓ |
| 38 | H | ↓ | ↓ | ↓ | ↓ | ↓ |
| 6 | L | L | H | ↓ | ↓ | ↓ |
| 37 | H | ↓ | ↓ | ↓ | ↓ | ↓ |
| 5 | L | H | L | ↓ | ↓ | ↓ |
| 36 | H | ↓ | ↓ | ↓ | ↓ | ↓ |
| 4 | L | L | L | H | L | L |
| 35 | H | ↓ | ↓ | ↓ | ↓ | ↓ |
| 3 | L | H | H | ↓ | ↓ | ↓ |
| 34 | H | ↓ | ↓ | ↓ | ↓ | ↓ |
| 2 | L | L | H | ↓ | ↓ | ↓ |
| 33 | H | ↓ | ↓ | ↓ | ↓ | ↓ |
| 1 | L | H | L | ↓ | ↓ | ↓ |
| 32 | H | ↓ | ↓ | ↓ | ↓ | ↓ |
| 0 | L | L | L | L | L | L |

FBD — SBD — LBD

FSD; USD (4USD = 1 SSD); LSD

007# DECODING CIRCUIT FOR DECODING MULTIBIT DATA, AND A DISPLAY APPARATUS UTILIZING THE SAME

BACKGROUND OF THE INVENTION

1. Field of the Invention

The present invention relates to a decoding circuit for decoding multibit digital data to output an electric signal (voltage) corresponding to the multibit digital data, and particularly relates to a decoding circuit used for digital to analog conversion by which multibit digital data is converted into an analog electric signal, and a display apparatus using such decoding circuit. Specifically, the present invention relates to a configuration of a decoding circuit of a digital/analog converter that generates pixel writing voltage in accordance with input pixel data in an image display apparatus.

2. Description of the Background Art

Where one candidate is to be selected from a plurality of output candidates, a decoding circuit is generally utilized. In the case of a digital signal of n bits, one candidate can be selected from $2^n$ output candidates, where the symbol "^" indicates a power. Thus, as compared with a configuration in which a selection signal is inputted to each output candidate, an occupancy area of the circuit can be reduced.

The configuration of the decoding circuit differs depending on application for which this decoding circuit is utilized. For example, where one of a plurality of signal lines is driven to a selected state as in an address decoding circuit in a memory circuit, a decoding circuit utilizing a logic gate such as a NAND type decoding circuit is used. According to combination (pattern) of bit values of n-bit digital data, a logic gate group drives one signal line out of the plurality of signal lines.

On the other hand, in the case where one electric signal is selected from a plurality of electric signals (indicating current or voltage) to be outputted, a ROM type decoding circuit using a switch matrix is generally used. A switching element in the switch matrix is selectively put into a conductive state in accordance with an input multibit digital signal, and a transmission path of one electric signal is decided. The one electric signal is transmitted to an output unit along this decided path. The connection between the switching element and the input multibit digital data is set uniquely and in a fixed manner, and a relation between an on/off states of the switching elements and the corresponding input multibit digital signal bits is also determined uniquely.

The ROM type decoding circuit as described above is in many cases utilized for a look-up table or the like, and one of specific applications of such decoding circuit is a digital/analog converting circuit that converts an input multibit digital data to an analog signal (voltage). Reference voltages corresponding to the respective levels which an input multibit digital data can represent are prepared. In a decoding operation, the reference voltage corresponding to a value of the inputted multibit digital data is selected. The values that input multibit digital data represents are discrete values, and the reference voltage levels are also discrete. This reference voltage takes a voltage level according to the bit value of an input digital data between a maximum value and a minimum value of the multibit digital data, and thus, a voltage resulting from converting the input multibit digital data to an analog voltage can be provided as an output voltage.

Such a digital/analog converting circuit is used in a driving circuit for generating a writing voltage to a pixel in a liquid crystal display apparatus. The reference voltage is selected corresponding to the input pixel data, and the selected reference voltage is written into a pixel electrode of a display element such as a liquid crystal element. In the case where the display element is the liquid crystal element, brightness of the pixel is set in accordance with the voltage between the pixel electrodes, an intermediate value between white and black can be represented in the liquid crystal element, and gradation display can be achieved. These liquid crystal elements are provided corresponding to red (R), green (G), and blue (B), respectively, thereby achieving the gradation display of a color image.

In the case where the data of pixels has n bits, the gradation displays of $2^n$ levels are enabled. Accordingly, for the reference voltage levels, $2^n$ levels are required. As an example, if n=6, then $2^6$ is 64, and 64-level gradation display is enabled in each of red (R), green (G), and blue (B), so that multicolor display corresponding to 260,000 colors can be achieved. Moreover, if n=8, 256 (=$2^8$) level gradation display is enabled in each of red (R), green (G), and blue (B), so that multicolor display corresponding to 16,770,000 colors is enabled.

Now, a digital/analog converting circuit for one color is considered. In the case where the digital/analog converting circuit is implemented by the ROM type decoding circuit, in a configuration utilizing a switch matrix, simply, switching transistors receiving input digital signal bits respectively are connected in series corresponding to the respective reference voltage levels. In this case, ($n \times 2^n$) switching elements are required, which increases the decoding circuit in layout area. Here, "^" indicates a power. Accordingly, when a driving circuit is formed integrally with a display panel on the same chip, a chip area becomes large, which significantly hinders the downsizing of the display apparatus.

Configuration for reducing the size of the digital/analog converting circuit for generating pixel writing voltage in the pixel display apparatus are disclosed in Japanese Patent Laying-Open No. 2001-133754, Japanese Patent Laying-Open No. 2005-283777, and Japanese Patent Laying-Open No. 2003-241716.

In the configuration disclosed in Japanese Patent Laying-Open No. 2001-133754, a decoder is provided, in which based on a content of gradation selection bits introduced in a column direction, one of multilevel gradation voltage signals passes in a row direction and outputted. In each row, a least significant bit decoding unit and a higher-order bit decoding unit are provided. The least significant bit decoding unit selects and outputs one of the plurality of (two) gradation voltage signals in accordance with the least significant bit of the gradation selection bits. The higher-order bit decoding unit is provided corresponding to the least significant bit decoding unit, and selectively passes the gradation voltage signal in the corresponding row in accordance with the higher-order bits other than the least significant bit among the gradation selection bits. The higher-order bit decoding unit has a plurality of transistor elements arranged in series in each row, to which the different gradation selection bits are applied, respectively.

In this prior art reference, a signal line transmitting a gradation voltage signal is made common, and one of the plurality of gradation voltage signals selected by the lower-order bit is selected by the higher-order bit decoding unit and outputted. This reduces the number of the gradation voltage signal lines and the number of transistors arranged in a vertical direction in proportion with the number of gradations, to reduce the size in the vertical direction (direction in which the gradation voltages are arranged).

In Japanese Patent Laying-Open No. 2005-283777, a decoding circuit unit for selecting a gradation voltage is constructed by a dynamic circuit. In this decoding circuit, a transistor of the same logic is made common in decoders selecting adjacent gradation voltages. The gradation voltage is selected in accordance with a so-called "tournament method", in which 2 to 1 selection is performed at each bit position. In this prior art reference, the decoder circuit is constructed by a dynamic circuit, and when display pixel data successively applied, gradation voltages are prevented from being simultaneously put into a selected state in gradation voltage selection based on such successive display pixel data.

In Japanese Patent Laying-Open No. 2003-241716, the number of arranged decoders is reduced by applying a time-divisionally driven gradation reference voltage. Specifically, first, the least significant bit is forced to an even-number value, and a gradation reference voltage at each even number position is selected and held at an output capacitance. Subsequently, gradation reference voltages in odd number positions are selectively selected in accordance with the input data bits. When the input data is an even number value, the gradation reference voltage in the odd number position is not selected, but the even number gradation voltage selected previously is outputted.

In the configuration of the decoding circuit disclosed in Japanese Patent Laying-Open No. 2001-133754, the transistor elements provided for the least significant bit are arranged in parallel in each row, and one of two gradation voltages is selected in each row in accordance with this least significant bit. In the higher-order bit decoding unit, a series body of the transistor elements selectively turning on in accordance with the higher-order bits is arranged in each row. Accordingly, this parallel arrangement increases a geometrical dimension in the horizontal direction (row extending direction), as compared with the configuration of a decoder in which a series body of the transistor elements turning on in accordance with the gradation voltage selection bits for each of the gradation voltages is arranged. Normally, in the image display apparatus, the decoding circuit selecting a gradation voltage is arranged corresponding to the data line of each pixel column. Accordingly, when the horizontal size of the decoding circuit increases, it becomes difficult to arrange the decoding circuit corresponding to each pixel column, which makes it difficult to achieve higher resolution of the display apparatus. In addition, in one decoding circuit, the higher-order bit decoding circuits arranged in the respective rows are commonly coupled to a gradation voltage Output line. Accordingly, the number of the transistor elements (switching elements) connected to this output line is reduced to only half times, as compared with the conventional configuration in which a series body of switching elements are arranged for each gradation reference voltage. As a result, there arises a problem in that parasitic capacitance associated with the output line is large, and a response speed of the decoding circuit slowed down, and thus, high-speed operation cannot be achieved.

Further in this prior art reference, the switching element selectively passing the gradation voltage is comprised of a single transistor element. Accordingly, for example, when the gradation voltage is an intermediate voltage, if a gate voltage is not set to a sufficient level, due to threshold voltage loss across this switching element, it is difficult to transmit the intermediate voltage precisely. Accordingly, in the configuration of the decoding circuit described in this prior art reference, there arises a problem in that it is difficult to set the output voltage within a specified time in a recent situation where the decoding time is reduced with an increase in number of pixels due to higher resolution, and others.

In the configuration described in Japanese Patent Laying-Open No. 2005-283777, the gradation voltage selection bits are decoded through the so-called "tournament method", in which 2 to 1 selection is performed for each bit, and in accordance with the decoding result, a gradation voltage is selected to be transmitted to the output line. Accordingly, by sharing the decoding circuit unit, the transistor elements are reduced in number. However, the number of transistor stages of the decoder for the respective reference voltages is the same as in the case where the reference voltage is selected in accordance with a NAND type decoder configuration. Accordingly, it is difficult to reduce the vertical and horizontal sizes. In addition, transmission gates transmitting the respective gradation voltages are connected to the output line. Accordingly, the parasitic capacitance associated with this output line is large, which causes a problem that it is difficult to transmit a gradation voltage to the output line and stabilize the gradation voltage on the output line at high speed.

In the configuration disclosed in Japanese Patent Laying-Open No. 2003-241716, the gradation reference voltage is time-divisionally driven to be supplied, the number of the decoding circuits is reduced, and thus, the vertical size can be reduced. However, since the gradation reference voltage is transmitted through the time division, transition to a corresponding potential needs to be made within a predetermined time in each reference voltage line. Therefore, a higher-speed driving is required in the decoding circuit because of the time-division driving, and there arises a problem that it is difficult to generate sufficiently stabilized gradation voltage even in the situation where the decoding time is reduced due to the increase in number of pixels.

In addition, in the configuration of such prior art reference, the reference voltage lines are arranged in parallel to transistor rows constructing the decoding circuits, and are commonly provided for the decoding circuits arranged corresponding to the respective pixel data lines. Accordingly, there arises a problem that when this reference voltage lines are time divisionally driven, a potential fluctuation generates an analog noise through the capacitive coupling, which makes it difficult to generate the precise gradation voltage.

These configuration of the decoding circuits are not only limited to the application to the configuration of the digital/analog converting circuit that generates the analog voltage in accordance with input digital data, but, for example, in a configuration of a switch matrix circuit in which a transmission path of a certain signal is established by the decoding circuit, and the like, similar problems to those of these decoding circuits as described above arise.

SUMMARY OF THE INVENTION

An object of the present invention is to provide a decoding circuit capable of performing a decoding operation at high speed with a small occupancy area to precisely and stably generate an output signal according to an input signal.

Another object of the present invention is to provide a digital/analog conversion decoding circuit capable of performing a decoding operation of input data at high speed with a smaller number of elements to generate an analog voltage signal, and a display apparatus including such decoding circuit.

A decoding circuit according to the present invention includes a first bit group decoding circuit provided corresponding to a first bit group having at least one bit of multibit digital data having a plurality of bits, for decoding the bit of the first bit group to select and output output candidates corresponding to a decoding result from a plurality of output candidates arranged in a first direction. The first bit group decoding circuit includes a plurality of first sub-decoding circuits each arranged one for each group of a predetermined number of output candidates, for commonly receiving the bit of the first bit group to select an output candidate from the corresponding output candidate group. The multibit digital data is divided into a plurality of bit groups at least one of which has a plurality of bits. The plurality of bit groups include the first bit group. Bit group decoding circuits are arranged corresponding to the respective bit groups, and the bit group decoding circuits include the first bit group decoding circuit. Each of the first sub-decoding circuits includes a plurality of unit decoders that are provided for the different output candidates and arranged in parallel in a second direction.

The decoding circuit according to the present invention further includes a last bit group decoding circuit provided corresponding to a last bit group of the plurality of bit groups, for commonly receiving and decoding the bit of the last bit group. The last bit group decoding circuit includes a plurality of final sub-decoding circuits arranged corresponding to the respective outputs of the bit group decoding circuit at a preceding stage, for selecting a corresponding output in accordance with the bit of the last bit group for transmission to an output signal line.

A display apparatus according to the present invention includes a digital/analog converting circuit including a decoding circuit according to the present invention for converting display pixel data into an analog voltage represented by multibit digital data of the display pixel data, a plurality of data lines each coupling to a plurality of display pixels, and a data line driving circuit for driving the data lines in accordance with the analog voltage outputted by the digital/analog converting circuit.

In the decoding circuit according to the present invention, in the first bit group decoding circuit, in each of the first sub-decoding circuits that selects one output candidate from the group of the plurality of output candidates, the unit decoders arranged corresponding to the different output candidates are arranged in parallel along the direction different from the arrangement direction of the output candidates. In bit group data decoding circuit at the next or subsequent stage, one of outputs of the group of the sub-decoding circuits is selected. Accordingly, the size in the direction in which the output candidates of the decoding circuit are arranged can be reduced. For example, in the case where the first bit group is formed of one bit, the size of the decoding circuit in the arrangement direction of the output candidates can be reduced to down to half times.

In addition, the last bit group decoding circuit selectively transmits the output of the bit group decoding circuit at the preceding stage to the output signal line. Accordingly, the number of the final sub-decoding circuits connected to the output signal line can be reduced down to the number of outputs of the bit group decoding circuit at the preceding stage, which can reduces parasitic capacitance of the output signal line.

Further, by applying this decoding circuit to a circuit for generating gradation voltage of the image display apparatus, a pixel driving circuit with a small occupancy area capable of generating gradation voltage in accordance with input pixel data at high speed can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram showing a list of relations between conductive states of the respective sub-decoding circuits and logic of given data bits in the decoding circuit shown in FIGS. 4 and 5;

FIG. 18 is a diagram showing a list of logic of switching elements in a decoding circuit according to Embodiment 3 of the present invention;

DESCRIPTION OF THE PREFERRED EMBODIMENTS

[Conceptual Configuration]

Figure 1:
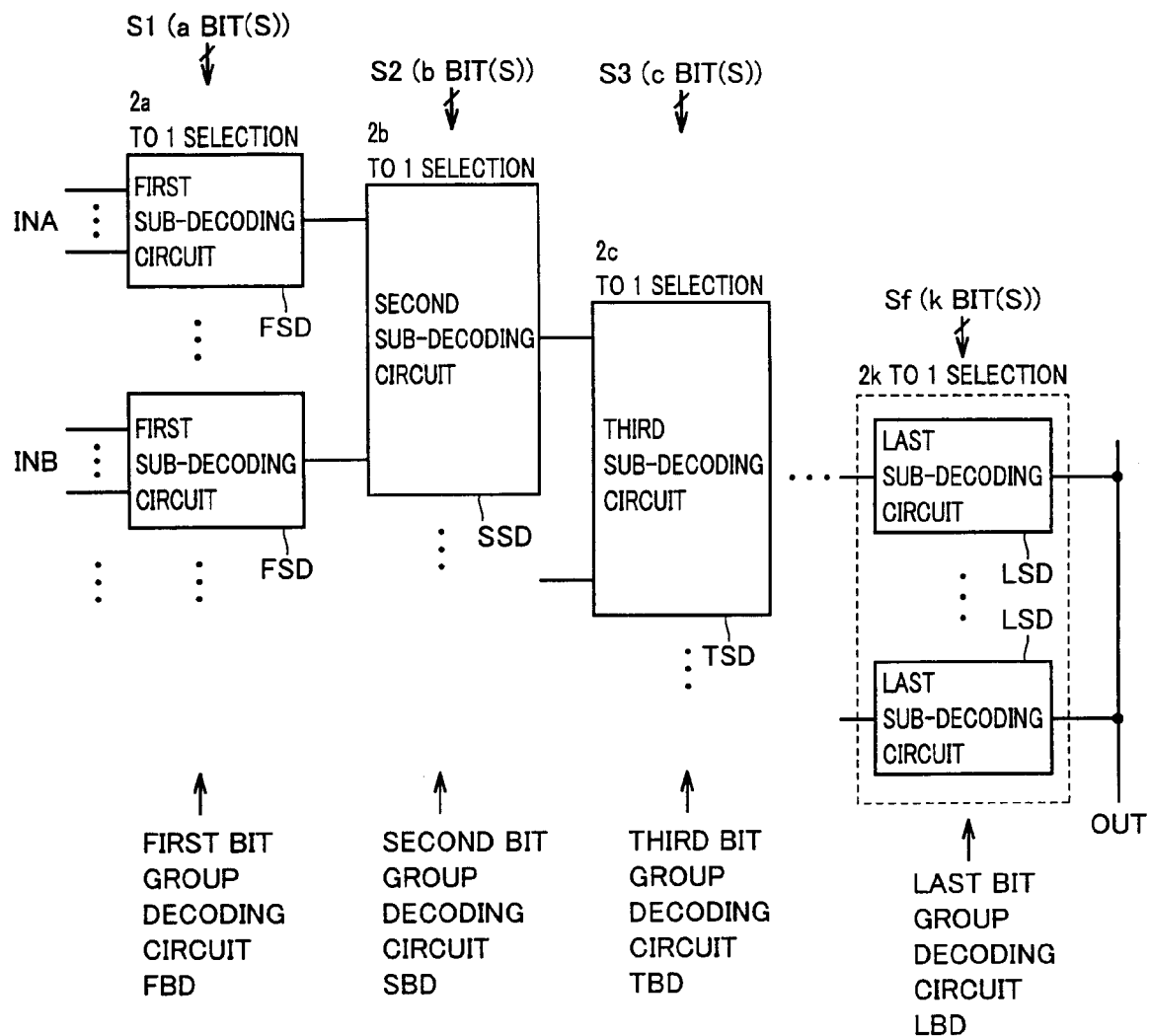
FIG. 1 is a diagram schematically showing a conceptual configuration of a decoding circuit according to the present invention.

FIG. 1 is a diagram showing a conceptual configuration of a decoding circuit implemented according to the present invention. In FIG. 1, a configuration of a main part of the decoding circuit according to the present invention is schematically shown. In FIG. 1, a selection control signal (multibit digital data) for selecting an input IN (INA, INB . . . ) constructing output candidates is divided into a plurality of bit groups. In FIG. 1, the multibit digital data is divided into control signal bit groups S1 (a bit(s)), S2 (b bit(s)), S3 (c bit(s)), . . . and Sf (k bit(s)). A first bit group decoding circuit FBD, a second bit group decoding circuit SBD, a third bit group decoding circuit TBD, . . . and a last bit group decoding circuit LBD are provided corresponding to these bit groups S1 (a bit(s)), . . . Sf(k bit(s)), respectively.

First bit group decoding circuit FBD includes first sub-decoding circuits FSD provided corresponding to $(2^a)$ input (output candidate) groups IN (INA, INB), respectively. These first sub-decoding circuits FSD perform a $(2^a)$ to 1 selection in accordance with control signal bit group S1 (a bit(s)) to select one input from the corresponding $(2^n)$ inputs.

Second bit group decoding circuit SBD includes second sub-decoding circuits SSD provided corresponding to $(2^b)$ first sub-decoding circuits FSD. These second sub-decoding circuit SSD perform a $(2^b)$ to 1 selection in accordance with control signal bit group S2 (b bit(s)) to select one from the outputs of corresponding $(2^a)$ first sub-decoding circuits FSD.

Third bit group decoding circuit TBD includes third sub-decoding circuits TSD provided corresponding to the group of $(2^c)$ sets of second sub-decoding circuits SSD. These third sub-decoding circuits TSD perform a $(2^c)$ to 1 selection in accordance with control signal bit group S3 (c bit(s)) to select one from the outputs of corresponding $(2^c)$ second sub-decoding circuits SSD.

Subsequently, similar selection operation is performed in the bit group decoding circuit arranged corresponding to the bit group of the control signal bits.

Last bit group decoding circuit LBD includes last sub-decoding circuits LSD provided corresponding to outputs of $(2^k)$ sub-decoding circuits at the preceding stage, respectively. These last sub-decoding circuits LSD selects one of the outputs of $(2^k)$ sub-decoding circuits at the preceding stage in accordance with control signal bit group Sf (k bit(s)) to generate a last output OUT. Each of the last sub-decoding circuits LSD includes a series body of switching elements selectively turning on in accordance with the bit(s) of control signal bit group Sf (k bit(s)), respectively.

In the configuration of the decoding circuit shown in FIG. 1, input (output candidates) IN specified by the multibit selection control signal composed of control signal bit groups S1 (a bit(s)) to Sf (k bit(s)) is selected to generate last output OUT.

At least one of the numbers of bits a, b, c, . . . k of respective control signal bit groups is plural, and in each of the bit group decoding circuits, the number of stages of the bit group decoding circuits of the decoding circuit is reduced as compared with a "tournament method" in which 2 to 1 selection is performed in each of the bit group decoding circuits.

In last bit group decoding circuit LBD, last sub-decoding circuits LSD are each configured of a series body of the switching elements. Accordingly, the number of the switching elements coupled to an output line that generates last output OUT is greatly reduced, which can reduce parasitic capacitance associated with the output line. Thus, the decoding operation can be performed at high speed in accordance with the control signal, to generate last output OUT.

Figure 2:
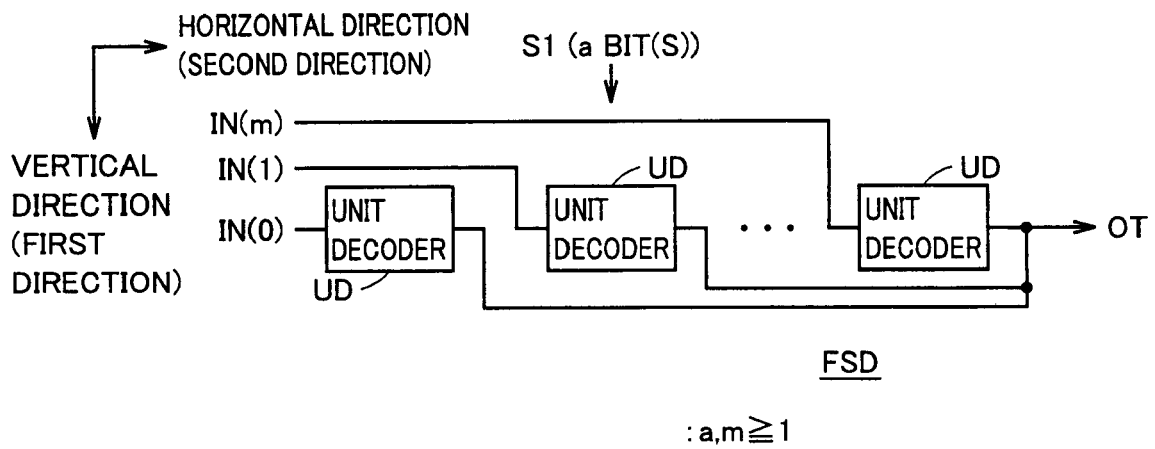
FIG. 2 is a diagram schematically showing a configuration of a first sub-decoding circuit showing in FIG. 1.

FIG. 2 is a diagram schematically showing a configuration of first sub-decoding circuit FSD shown in FIG. 1. In FIG. 2, first sub-decoding circuit FSD includes unit decoders UD provided for a plurality of inputs (output candidates) IN(0) to IN(m). To these unit decoders UD, control signal bit group S1 (a bit(s)) is commonly applied. These unit decoders UD are arranged in parallel in a horizontal direction (second direction) with respect to a vertical direction (first direction) in which inputs (output candidates) IN(0) to IN(m) are aligned, and one of the unit decoder is selectively is made conductive in accordance with control signal bit group S1 (a bit(s)) to transmit corresponding input IN(i) to output OUT. In this case, reference numerals a, m are integers of one or more.

Accordingly, in the case where (m+1) inputs (output candidates) are provided, unit decoders UD are arranged in parallel in alignment in a horizontal row, which can reduce a vertical size of the decoding circuit. Accordingly, the parasitic capacitance of the output line can be reduced and in addition, the vertical size of the decoding circuit can be reduced. Consequently, the decoding circuit having a high-speed operating characteristic with a small occupancy area can be achieved.

Figure 3:
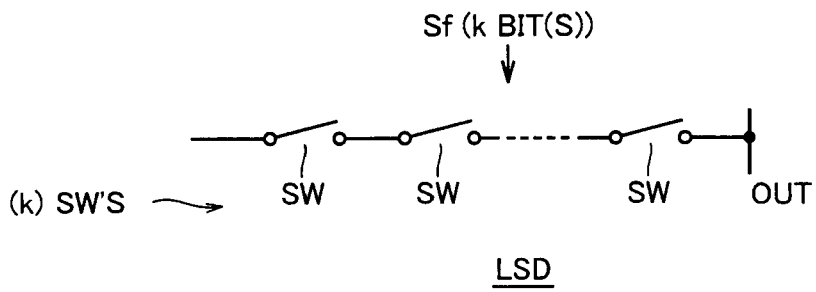
FIG. 3 is a diagram schematically showing a configuration of a final sub-decoding circuit shown in FIG. 1.

FIG. 3 is a diagram schematically showing a configuration of last sub-decoding circuit LSD shown in FIG. 1. As shown in FIG. 3, last sub-decoding circuit LSD includes a series body of (k) switching elements SW arranged corresponding to the respective bits of corresponding control bit group Sf (k bit(s)). This series body of (k) switching elements SW selectively turns conductive in accordance with control signal bit group Sf (k bit(s)) to form a signal propagation path. Only one switching element is connected to the output line in the last sub-decoding circuit LSD. Accordingly, even if the switching element is formed of, e.g., a TFT (thin film transistor), and parasitic capacitance between a gate and a drain thereof is large, only the capacitance between the gate and the drain of the switching element of each of the last sub-decoding circuits is connected, and thus parasitic capacitance of the output line can be reduced.

Embodiment 1

Figure 4:
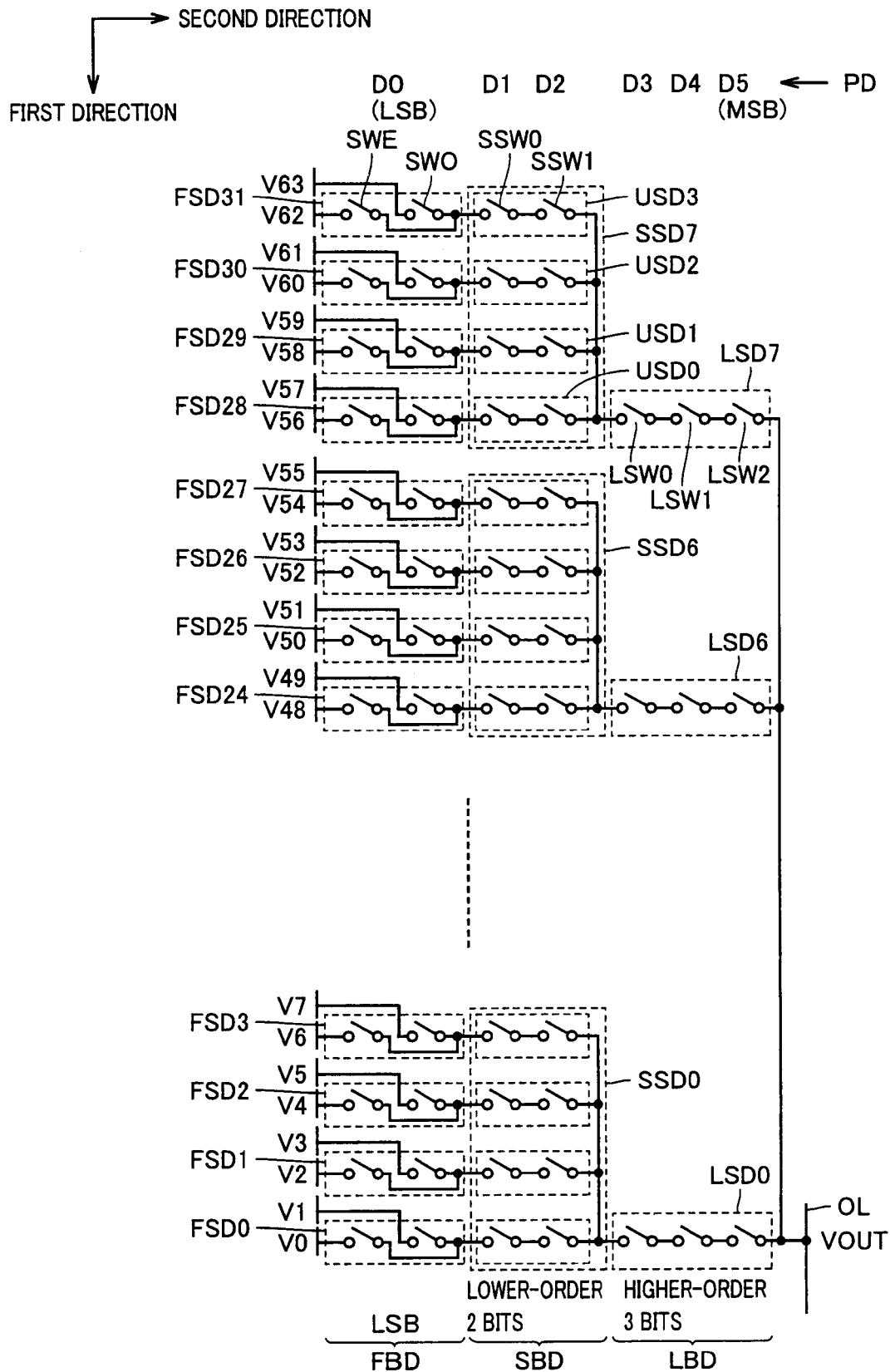
FIG. 4 is a diagram schematically showing a configuration of a decoding circuit according to Embodiment 1 of the present invention.

FIG. 4 is a diagram schematically showing a configuration of a decoding circuit according to Embodiment 1 of the present invention. In FIG. 4, a configuration of the decoding circuit in which one out of 64 output candidates V0-V63 is selected in accordance with 6 bits D0 to D5 of multibit digital data PD, to be outputted to an output line OL as an output signal VOUT is shown as an example. Output candidates V0 to V63 are reference voltages of different voltage levels as an example, and are gradation voltages utilized as pixel writing voltage in an image display apparatus. Respective subscripts of the reference voltages correspond to gradations 0 to 63, and the reference voltage (gradation voltage) corresponding to the subscript (gradation) represented by data bits D0 to D5 is selected and transmitted to output line OL as a last electric signal.

In FIG. 4, the decoding circuit includes first bit group decoding circuit FBD that performs 2 to 1 selection with respect to output candidate groups V0 to V63 in accordance with least significant bit (LSB) D0 of multibit digital data PD, second bit group decoding circuit SBD that performs 4 to 1 selection with respect to the outputs of first bit group decoding circuit FBD in accordance with lower-order 2 bits D1 and D2, and last bit group decoding circuit LBD that performs 8 to 1 selection with respect to the outputs of second bit group decoding circuit SBD in accordance with remaining higher-order 3 bits D3 to D5, to select one from the outputs of second bit group decoding circuit SBD and transmit an output voltage VOUT to the output line.

Data bit D5 is the most significant bit (MSB). By performing the 2 to 1 selection in first bit group decoding circuit FBD, performing the 4 to 1 selection in second bit group decoding circuit SBD, and performing the 8 to 1 selection in last bit group decoding circuit LBD, one output candidate is selected from 64 output candidates V0 to V63, to be outputted.

First bit group decoding circuit FBD includes first sub-decoding circuits FSD0 to FSD31 each, provided for two adjacent output candidates, for selecting one voltage from the corresponding two output candidates (hereinafter referred to gradation voltage) in accordance with the least significant bit D0.

Each of these first sub-decoding circuits FSD0 to FSD31 includes switching elements SWE and SWO that select one of the corresponding adjacent gradation voltages in accordance with bit D0 and an inverted bit /D0 (D0B). Each of these switching elements SWE and SWO is used as a unit decoder of the corresponding sub-decoding circuit. These switching elements SWE and SWO are arranged in parallel along the second direction perpendicular to the first direction in which gradation voltages V0 to V63 are arranged in alignment along input nodes.

In first sub-decoding circuits FSD0 to FSD31 commonly receiving bit D0, switching elements SWE and SWO each functioning as one unit decoder are arranged in parallel in alignment along the second direction. Therefore, as for first sub-decoding circuits FSD0 to FSD31, only one sub-decode circuit needs to be provided for two gradation voltages, so that the size of the decoding circuit in the vertical direction (first direction) can be halved as compared with a configuration in which switching elements (unit decoders) SWE and SWO are arranged along the first direction corresponding to each gradation voltage. In addition, the first sub-decoding circuits only perform the decoding operation in accordance with least significant bit (LSD) D0, and thus, an increase in size of the decoding circuit in the horizontal (second direction) is equivalent to only one switching element, thereby keeping an increase in horizontal size small.

Second bit group decoding circuit SBD includes second sub-decoding circuits SSD0 to SSD7 each provided corresponding to a group of a predetermined number (four) of the sub-decoding circuits of first sub-decoding circuit FSD0 to FSD31. Each of these second sub-decoding circuits SSD0 to SSD7 commonly receives bits D1 and D2, and selects the output of one sub-decoding circuit from the corresponding group of the first sub-decoding circuits. These second sub-decoding circuits SSD0 to SSD7 each include unit decoders USD0 to USD3 provided corresponding to the respective four first sub-decoding circuits of the corresponding group. These unit decoders USD0 to USD3 each include a series body of switching elements SSW0 and SSW1 selectively turning on in accordance with bits D1 and D2. When switching elements SSW0 and SSW1 are both set to a conductive state, the corresponding unit decoder transmits the output of the corresponding first sub-decoding circuit to last bit group decoding circuit LBD.

These switching elements SSW0 and SSW1 are each composed of either of a positive polarity switch that turns on when the applied bit is an H level ("1") and a negative polarity switch that turns on when the applied bit is an L level (logic "0"). According to such construction, one of unit decoders USD0 to USD3 enters a conductive state in each of second sub-decoding circuits SSD0 to SSD7 in accordance with the combination of logical values of lower-order 2 bits D1 and D2.

Last bit group decoding circuits LBD includes last sub-decoding circuits LSD0 to LSD7 provided for the outputs of second sub-decoding circuits SSD0 to SSD7, respectively. These last sub-decoding circuits LSD0 to LSD7 are each composed of a series body of switching elements LSW0 to LSW2 that selectively turn into a conductive state in accordance with bits D3 to D5, respectively. Each of these switching elements LSW0 to LSW2 are also composed of a positive polarity switch or a negative polarity switch, and one of last sub-decoding circuits LSD0 to LSD7 turns into the conductive state in accordance with the pattern of bits D3 to D5. Accordingly, each of these last sub-decoding circuits LSD0 to LSD7 also functions as a unit decoder of last sub-decoding circuit for selecting one of the outputs of the sub-decoding circuits at the preceding stage.

Only eight last sub-decoding circuits LSD0 to LSD7 are coupled to output line OL in parallel, which can reduce the parasitic capacitance of the output line OL, so that output voltage VOUT of output line OL can be generated in accordance with the decoding result at high speed. In addition, in the case where each of the switching elements is composed of a MOS transistor, a capacitance value thereof becomes largest when the switching element has a channel formed to function as a MOS capacitor. In this case, the four last output stage transistors turn into a conductive state in the last sub-decoding circuits LSD0 to LSD7, and therefore, the parasitic capacitance of output line OL can be reduced.

Figure 5:
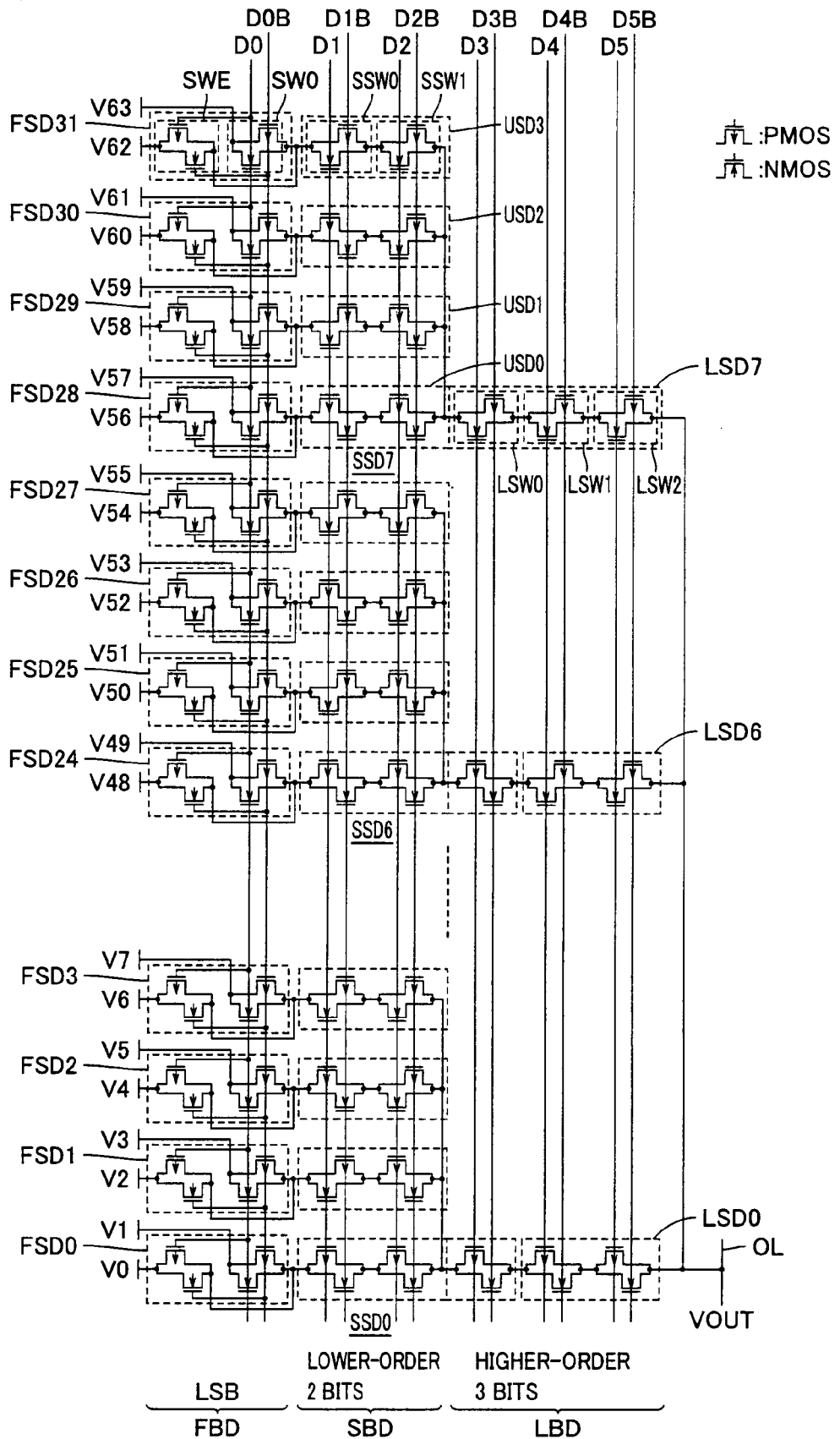
FIG. 5 is a diagram schematically showing an array of switching elements of the decoding circuit shown in FIG. 4.

FIG. 5 is a diagram showing an example of a specific configuration of the switching elements of the decoding circuit shown in FIG. 4. In the configuration of the decoding circuit shown in FIG. 5, parts corresponding to the decoding circuit shown in FIG. 4 are indicated by the same reference numerals, of which detailed descriptions will not be repeated.

In FIG. 5, switching elements SWE, SWO, SSW0 to SSW1 and LSW0 to LSW2 are each composed of a CMOS transmission gate (analog switch) formed of a parallel body of a P channel MOS transistor (insulated gate field effect transistor) and an N channel MOS transistor. In FIG. 5, the P channel MOS transistor is indicated by outward arrow in a substrate region, and the N channel MOS transistor is indicated by inward arrow in the substrate region.

Since switching elements SWE, SWO, SSW0 to SSW1, and LSW0 to LSW2 are each composed of the CMOS transmission gate, complementary data bits D0, D0B to D5, D5B are used to control their conduction. Here, DiB is an inverted bit of a bit Di.

Since the CMOS transmission gate is utilized for the switching element and complementary signals are utilized as a conduction control signal in electric signal propagation of the output candidates, threshold voltage loss of the MOS transistor does not need to be considered, so that signal amplitude of the conduction control signal (complementary data bits D0, D0B to D5, D5B) does not need to be expanded. For example, in the case where the gradation voltage is used as the output candidate, a binary signal changing between the maximum voltage and the minimum voltage of this gradation voltage can be utilized by the control signal, and current consumption in a circuit for generating the conduction control signal (data bits) can be reduced, and further, time required for stabilizing the conduction control signal (data bits) can be shortened.

FIG. 6 is a diagram showing a list of logics of the data bits when the respective switching elements (CMOS transmission gates) of the decoding circuit shown in FIGS. 4 and 5 are brought into a conductive state. In FIG. 6, downward arrow indicates that the unit decoders are coupled to the common output in a sub-decoding circuit. For example, in first sub-decoding circuit FSD31 provided for the gradation voltages V63 and V62, when data bit D0 is an H level, switching element SWO turns on to select gradation voltage V63, and when data bit D0 is an L level, switching element SWE shown in FIG. 5 turns on to select gradation voltage V62. Subsequently, in each of the first sub-decoding circuits provided for this least significant bit (LSB) D0, each pair of switching elements turned on complementarily in combination of the H level and L level of the data bit is provided as the unit decoder.

In each of second sub-decoding circuits SSD0 to SSD7 provided for data bits D1 and D2, switching element rows (unit decoders) turned on in accordance with the same logic of data bits D1 and D2 are arranged at the same position. For example, in second sub-decoding circuit SSD7, when data bits D1 and D2 are both the H level, unit decoder USD3 turns on to select the output of first sub-decoding circuit FSD 31 at the preceding stage. Accordingly, in each of second sub-decoding circuits SSD7 to SSD0, one unit decoder at the same position turns conductive in accordance with data bits D1 and D2, so that the 4 to 1 selection is performed, and thus, totally 8 to 1 selection is performed in accordance with the combination of the 2 to 1 selection in each of first sub-decoding circuits FSD31 to FSD0 by the least significant bit (LSB) D0.

In the last bit group decoding circuit, bits D3 to D5 are commonly applied to each of the switching elements of last sub-decoding circuits LSD7 to LSD0, and the switching elements selectively turn conductive in accordance with different combinations of these bits D3 to D5. For example, last sub-decoding circuit LSD7 turns conductive when bits D3 to D5 are all the H level to select the corresponding output voltage of second sub-decoding circuit SSD7 at the preceding stage.

In the last bit group decoding circuit LBD, one of the last sub-decoding circuits turns into a conductive state. Data bit D0 to D5 applied to the respective switching elements shown in FIG. 6 have the logical values increased sequentially in accordance with the voltage levels of gradation voltage V0 to gradation voltage V63 from the bit group in the lowest position in the first direction. Accordingly, one gradation voltage having a corresponding magnitude can be selected in accordance with data bits D0 to D5, which can achieve the analog conversion of digital data PD.

For example, when gradation voltage V32 is selected, data bits D0 to D5 take a value (pattern) of (L, L, L, L, L, H). In the last bit group decoding circuit LBD, the switching elements of last sub-decoding circuit LSD4 all turns into an on-state. In last sub-decoding circuits LSD3 to LSD0, the switching elements (LSW2) connected to output line OL are all kept in a nonconductive state, and their on-capacitance does not exert an effect the output line. In last sub-decoding circuits LSD7 to LSD5, although the switching elements LSW2 connected to output line OL is turned into an on-state, in last sub-decoding circuits LSD6 and LSD7, switching elements LSW1 (referred to FIG. 5) are in an off-state. In last sub-decoding circuit LSD5, switching element LSW0 (refer to FIG. 5) is in an off-state. In last sub-decoding circuit LSD4, switching element SSW1 (refer to FIG. 5) of the unit decoder of the second sub-decoding circuit for gradation voltage V34 is turned into an on-state, and parasitic capacitance (on-capacitance) to the input of last sub-decoding circuit LSD4 is additionally associated to the output line.

Accordingly, in the case where this gradation voltage V32 is selected, the on-capacitance other than the parasitic capacitance of last sub-decoding circuit LSD4 is only those of switching elements LSW2 of respective last sub-decoding circuits LSD6 and LSD7, and switching elements LSW1 and LSW2 of last sub-decoding circuit LSD5. Thus, the parasitic capacitance associated with output line OL can be significantly reduced, and an RC time constant in the propagation path of the selected reference voltage (gradation voltage) can be greatly reduced. This allows the gradation voltage corresponding to the gradation level selected in accordance with the decoding operation to be transmitted to output line OL at high speed.

In the last sub-decoding circuits decoding higher-order bit group D3 to D5, eight last sub-decoding circuits LSD0 to LSD7 are provided, in each of which only the series body of the switching elements is arranged, so that the number of the switching elements can be reduced. Accordingly, the load of the control signal lines transmitting these data bits D3 to D5 can be reduced, and thus data bits D3 to D5 can be set to a settled state at high speed, and further the power consumption can be reduced.

Figure 7:
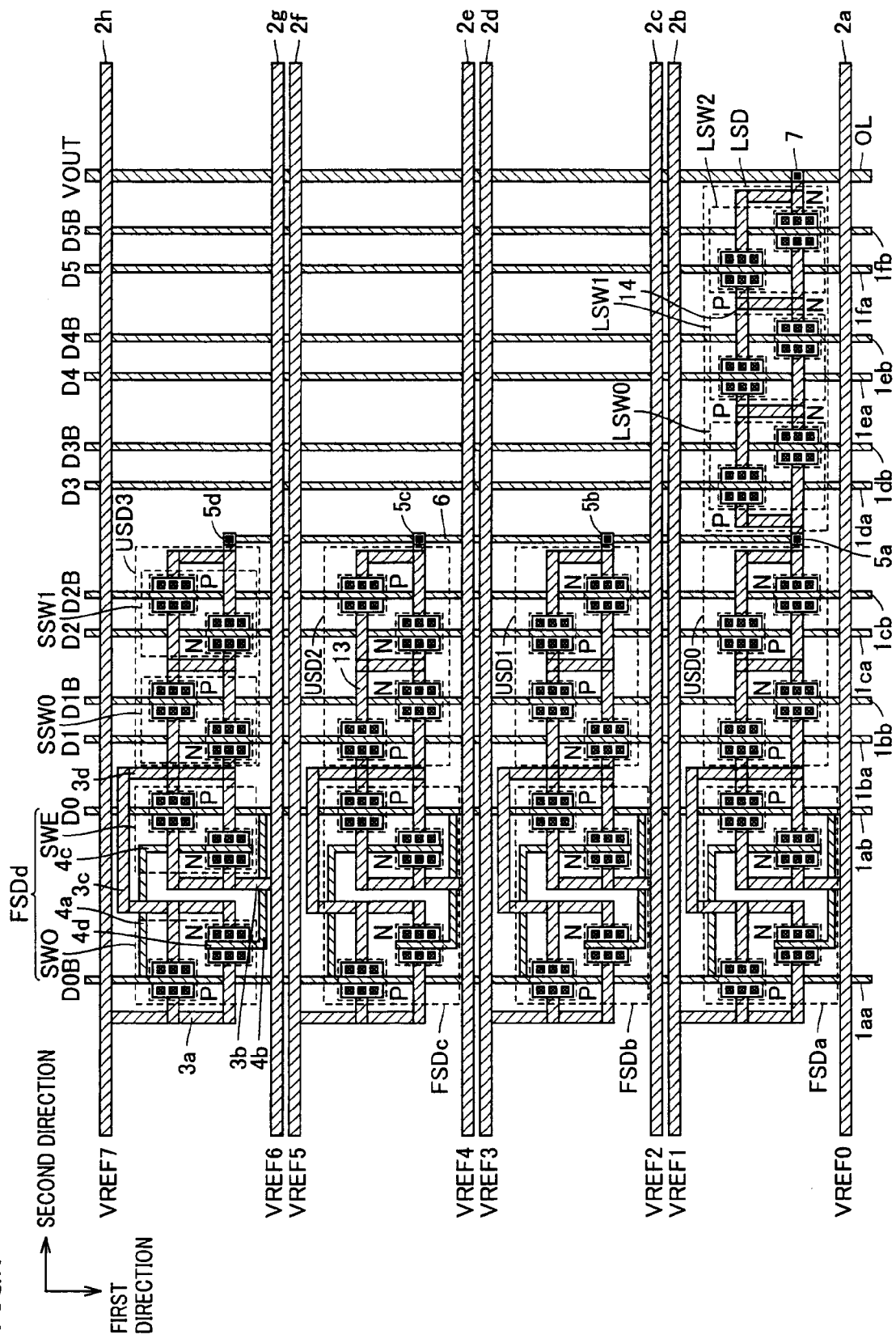
FIG. 7 is a diagram schematically showing a planar layout of the decoding circuit shown in FIG. 5.

FIG. 7 is a diagram schematically showing a layout of parts related to one of the last sub-decoding circuits in the decoding circuit in Embodiment 1 of the present invention. In FIG. 7, reference voltage lines 2a to 2h that transmit reference voltages VREF0 to VREF7 to last sub-decoding circuits LSD are disposed so as to be extended continuously and linearly along the second direction. These reference voltages VREF0 to VREF7 correspond to eight reference voltages for one of the last sub-decoding circuits among gradation voltages V0 to V63 shown in FIGS. 4 to 6. Since last sub-decoding circuit LSD corresponds to any one of last sub-decoding circuits LSD0 to LSD7 shown previously, here, the corresponding gradation voltages are indicated by reference voltages VREF0 to VREF7.

First sub-decoding circuits FSDa to FSDd each include switching elements SWO and SWE arranged between the reference voltage lines transmitting the two corresponding reference voltages. Since these first sub-decoding circuits FSDa to FSDd each have the same configuration, in FIG. 7, reference numerals are given to the switching elements for first sub-decoding circuit FSDd and corresponding interconnection lines thereof.

In FIG. 7, each of the first sub-decoding circuits includes switching elements SWO and SWE each composed of a P channel MOS transistor (indicated by P) and an N channel MOS transistor (indicated by N). These switching elements SWO and SWE are each arranged in alignment along the second direction. Reference voltage line 2h transmitting reference voltage VREF7 is coupled to the P channel MOS transistor and the N channel MOS transistor of switching element SWO through internal interconnection line 3a. In addition, the outputs of these transistors are connected commonly through an internal interconnection line, and then are coupled to an output node of switching element SWE through internal interconnection line 3d after laid out in a rectangular form close to reference voltage line 2h in an upper direction with respect to the first direction so as to bypass switching element SWE. In the switching element SWE, input portions of MOS transistors (P, N) are commonly coupled to reference voltage line 2g through internal connection line 3d.

In the first bit group decoding circuit, the P channel MOS transistors of switching elements SWO are arranged in alignment in the first direction. In these P channel MOS transistors, their gate electrodes are commonly coupled by a control signal line 1aa. Inverted data bit D0B is transmitted to control signal line 1aa.

In addition, similarly, as for switching elements SWE, the P channel MOS transistors are arranged in alignment along the first direction, and their gate electrodes are commonly coupled by a control signal line 1ab to receive data bit D0.

Further, in these first sub-decoding circuits FSDa to FSDd (in the first bit group decoding circuit), the N channel MOS transistors (N) of switching elements SWO are arranged in alignment in the first direction and the N channel MOS transistors (N) of switching elements SWE are arranged in alignment along the first direction.

The N channel MOS transistor is arranged between the P channel MOS transistors of switching elements SWO and SWE. Gate electrode interconnection line 4d of the N channel MOS transistor of switching element SWO is coupled to control signal line 1ab by branch line 4b extending in the second direction. On the other hand, the N channel MOS transistor (N) of switching element SWE is coupled to gate electrode interconnection line 4c through branch line 4a arranged close to internal interconnection line 3c along the second direction.

For the gate electrode interconnection line of the N channel MOS transistors (N) of these switching elements SWO and SWE, the branch interconnection lines are, respectively, disposed on the upper side and on the lower side in the first direction in a first sub-decoding circuit arranging region and are connected to control signal lines 1aa and 1ab. This layout allows the gate electrode interconnection lines for the N channel MOS transistors (N) of the switching elements SWO and SWE to be arranged without providing any crossing. This interconnection and layout can reduce the number of the crossings between the reference voltage lines (including the internal interconnection lines) transmitting the reference voltages and the control signal lines (branch lines 4a to 4d) transmitting the control signals (data bits D0, D0B). Accordingly, coupling capacitance between the reference voltage lines and the control signal lines can be reduced. Load capacitance of a circuit for generating reference voltages VREF0 to VREF7 and a buffer circuit for transmitting data bits D0, D0B can be reduced. The occurrence of analog noise due to the capacitive coupling can be suppressed and current consumption can be reduced, and further, the control signals can be changed at high speed to transmit the reference voltages.

For the second sub-decoding circuits (second bit group decoding circuit), control signal lines 1ba, 1bb, 1ca, and 1cb transmitting complementary data bits D1, D1B, D2, D2B are disposed in parallel to each other along the first direction. In each of unit decoders USD0 to USD3 of the second sub-decoding circuits, P channel MOS transistors and N channel MOS transistors are disposed such that gate electrodes thereof are alternately coupled to the control signal lines along the first direction. That is, in order to execute the 4 to 1 selection in accordance with 2-bit data D1 and D2 in unit decoders USD0 to USD3 of second sub-decoding circuits SSD, the P and N channel MOS transistors whose gate electrodes are connected to control signal lines 1ba, 1bb, 1ca and 1cb are disposed so as to realize four bit-value patterns.

For example, in unit decoder USD3, the gate electrode of the P channel MOS transistor (P) of switching element SSW0 is coupled to control signal line 1bb, and the N channel MOS transistor (N) is connected to control signal line 1ba. In switching element SSW1 of the second sub-decoding circuit SSD3, the respective gate electrodes of the P channel MOS transistor and the N channel MOS transistor are coupled to control signal lines 1cb and 1ca.

In next unit decoder USD2, while the interconnection of gate electrodes between the P and N channel MOS transistors and control signal lines 1ca and 1cb in switching element SSW1 is the same as that of unit decoder USD3, in switching element SSW0, the interconnection manner between the gate electrodes of the P and N channel MOS transistors and control signal lines 1ba and 1bb is different from that of unit decoder USD3. Accordingly, unit decoders USD0 to USD3 of the second sub-decoding circuit SSD can be respectively set into a conductive state in accordance with the combinations of logical values of data bits (D1, D2), that is, the combinations of (1, 1), (0, 1), (1, 0), and (0, 0). Unit decoders USD0 to USD3 of similar interconnection and layout are provided in each of second sub-decoding circuits SSD0 to SSD7.

In each of unit decoders USD0 to USD3 of second sub-decoding circuit SSD (SSD0 to SSD7), the inputs and the outputs of the transistors are mutually connected by internal interconnection line 13, and switching elements SSW0 and SSW1 are connected in series. The respective outputs (internal interconnection lines) of unit decoders USD0 to USD3 are coupled to vertical interconnection line 6 extending in the first direction through contacts 5a to 5d. Vertical interconnection line 6 allows the reference voltage selected by second sub-decoding circuits SSD (unit decoders USD0 to USD3) to be transmitted to last sub-decoding circuit LSD at the next stage.

In last sub-decoding circuit LSD, switching elements LSW0 to LSW2 are disposed in alignment along the second direction between reference voltage lines 2a and 2b. These switching elements LSW0 to LSW2 are each composed of a CMOS transmission gate (analog switch) with a parallel body of the P channel MOS transistor (P) and the N channel MOS transistor (N), and the switches are mutually connected in series through internal interconnection line 14. In these switching elements LSW0 to LSW2, pairs of complementary bits D3, D3B, D4, D4B, and D5, D5B are respectively applied through control signal lines 1*da*, 1*db*, 1*ea*, 1*eb*, and 1*fa*, 1*fb* extending linearly in the first direction.

In the arrangement shown in FIG. 7, last sub-decoding circuit LSD is turned into a conductive state when bits D3 to D5 are (0,0,0). In last sub-decoding circuit LSD, the layout positions of the P and N channels MOS transistors are also determined in accordance with the combination of the corresponding logical values of control data bits D3 to D5.

The output of the last sub-decoding circuit LSD is coupled to output line OL through a contact 7. Output line OL is arranged extending linearly along the first direction, and is commonly coupled to output portions of each of last sub-decoding circuits LSD0 to LSD7 of the last bit group decoding circuit.

In the transistor arrangement shown in FIG. 7, the P channel MOS transistors are arranged in alignment along the first and second directions, and similarly, the N channel MOS transistors are also arranged in alignment along the first and second directions. The P channel MOS transistors and the N channel MOS transistors are arranged staggered each other. In each of the sub-decoding circuits and the unit decoders, the MOS transistors of the respective switching elements can be easily disposed for the corresponding control signal lines in accordance with the logical values of the corresponding bits.

As shown in FIG. 7, the wiring of least significant bits (LSD) D0, D0B is arranged oppositely on both ends of the first sub-decoding circuit along the second direction. This can prevent the crossing between the control signal lines (data bit transmission lines) for switching elements SWO and SWE arranged in parallel along the second direction and the interconnection lines connecting the gates of the N channel MOS transistors of the switching elements. Accordingly, there is no need to provide an extraction line for connecting each of these control signal lines (data bit transmission lines) to the gate of the MOS transistor of switching element SWO or SWE by an interconnection line of a different interconnection layer from that of the control signal lines, and no contact for arranging such twisted or crossing interconnection is necessary, which can suppress an increase in layout area.

In the layout of the CMOS transmission gates of the decoding circuit shown in FIG. 7, the CMOS transmission gate is arranged in the region between the corresponding reference voltage lines such that the P channel MOS transistor is disposed on the higher voltage side (upper side), and the N channel MOS transistor is disposed on the lower voltage side (lower side). The arrangement of these MOS transistors may be reversed.

In addition, in first sub-decoding circuits FSDa to FSDd, internal gate electrode interconnection line (branch line) 4*a* and 4*b* may have the positions exchanged with respect to the shown arrangement. That is, gate electrode 4*d* of the N channel MOS transistor of switching element SWO may be coupled to control signal line 1*ab* transmitting bit D0 through the branch line extending in the second direction along reference voltage line 2*h*, and gate electrode interconnection line 4*c* of the N channel MOS transistor of switching element SWE may be coupled to control signal line 1*aa* through the branch line extending in the second direction along reference voltage line 2*g* transmitting reference voltage VREF6.

Further, as an interconnection layer, reference voltage lines 2*a* to 2*h* transmitting the reference voltages and internal interconnection lines 3*a* to 3*c* are formed of an interconnection lines of an upper layer than that of the gate electrode interconnection lines and the branch lines 4*a* to 4*d* to reduce the number of contacts to the gate electrodes of the MOS transistors for reducing a layout area of the switching elements. However, in consideration of voltage transmission characteristics, interconnection load and others, control signal lines 1*aa* to 1*fb* may be laid in an upper layer than that of reference voltage lines 2*a* to 2*h*.

[Layout Modification 1]

Figure 8:
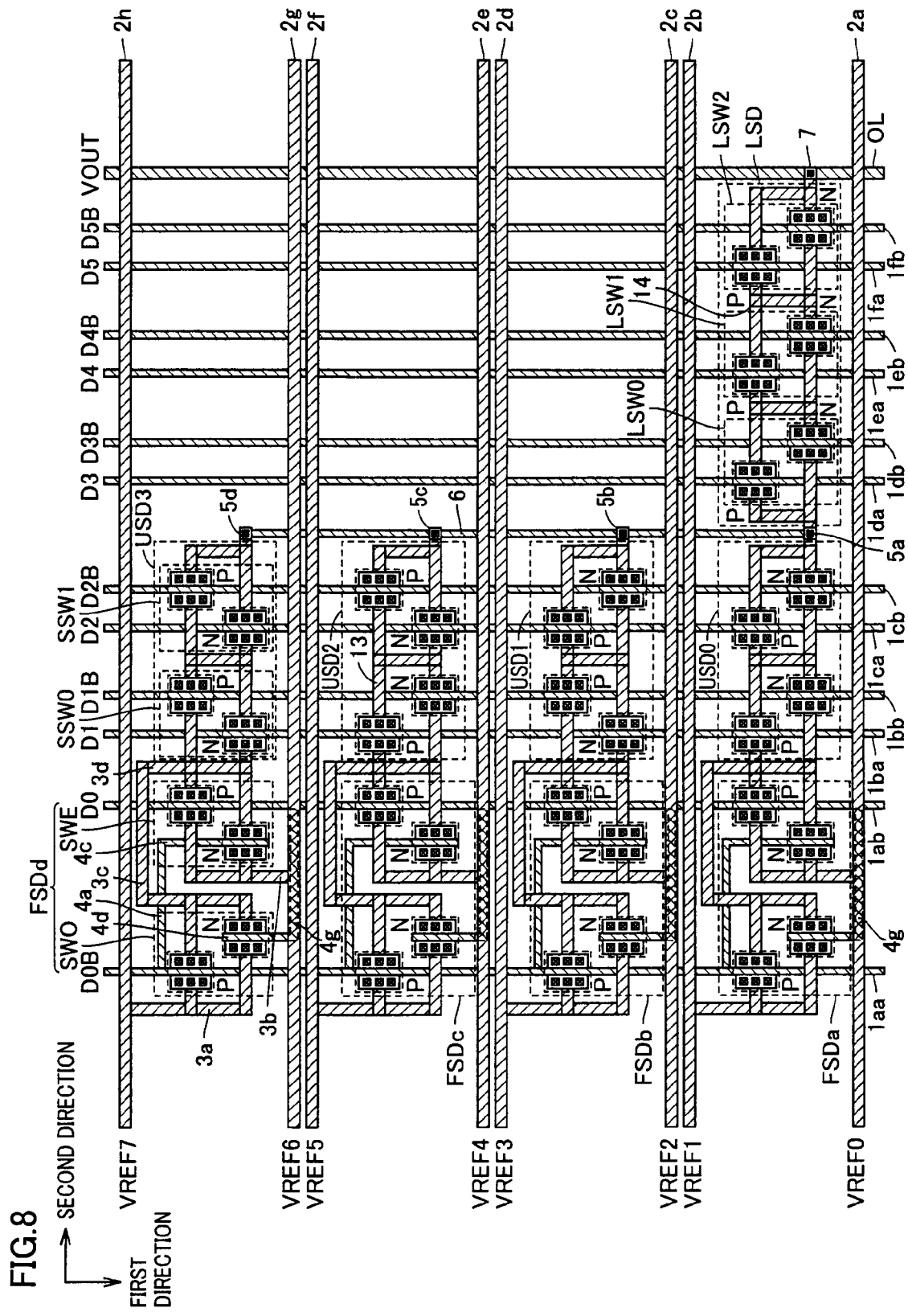
FIG. 8 is a diagram showing a modification of the planar layout of the decoding circuit shown in FIG. 5.

FIG. 8 is a diagram showing a modification of the layout of the decoding circuit according to Embodiment 1 of the present invention. In FIG. 8, in each of first sub-decoding circuits FSDa to FSDd receiving the least significant bit D0, electrode leading out branch line 4*g* for connecting gate electrode interconnection line 4*d* of the N channel MOS transistor of switching element SWO to control signal line 1*ab* is disposed overlapping reference voltage lines 2*g*, 2*e*, 2*c*, and 2*a* arranged adjacently. The remaining interconnection and layout of the decoding circuit shown in FIG. 8 is the same as the interconnection and layout of the decoding circuit shown in FIG. 7, and the same reference numerals are allotted to corresponding components and the detailed description thereof will not be repeated.

In the interconnection layout of the decoding circuit shown in FIG. 8, gate electrode leading out branch lines 4*g* overlap the corresponding reference voltage lines. Accordingly, by these overlapping portions, the size of this decoding circuit can be further reduced in the first direction. The overlapping between gate electrode leading out branch lines 4*g* and respective reference voltage lines 2*g*, 2*e*, 2*c* 2*a* causes coupling capacitance and load of control signal line 1*ab* becomes large, so that there is a possibility that high-speed driving is may be difficult to achieve. If this capacitive coupling poses a problem on the high-speed operating performance, then the set of data bits D0, D0B is individually and separately supplied to each f switching elements SWO and SWE, which makes the branch lines unnecessary and can reduce parasitic capacitance much more. That is, by disposing a pair of control lines transmitting data bits D0 and D0B for each of switching elements SWO and SWE, the gate electrode leading out branch line 4*a* and 4*g* (or 4*f*) does not need to be provided, and the vertical size of the decoding circuit can be reduced and also parasitic capacitance due to interconnection line overlapping can be suppressed.

In the layout shown in FIG. 8, gate electrode leading out branch line 4*a* which connects control signal line 1*aa* to gate electrode line 4*c* of the N channel MOS transistor of switching element SWE, may be also disposed so as to overlap the corresponding reference voltage line 2*h*.

In addition, in the layout of the decoding circuit shown in FIG. 8, gate electrode leading out branch line 4*g* is shown completely overlapping the corresponding reference voltage line. However, even when the reference voltage line and gate electrode leading out branch line 4*g* are shifted in position along the first direction, and are disposed such that a part of the lines overlaps each other, the size of the decoding circuit in the vertical direction (first direction) can be reduced.

[Layout Modification 2]

Figure 9:
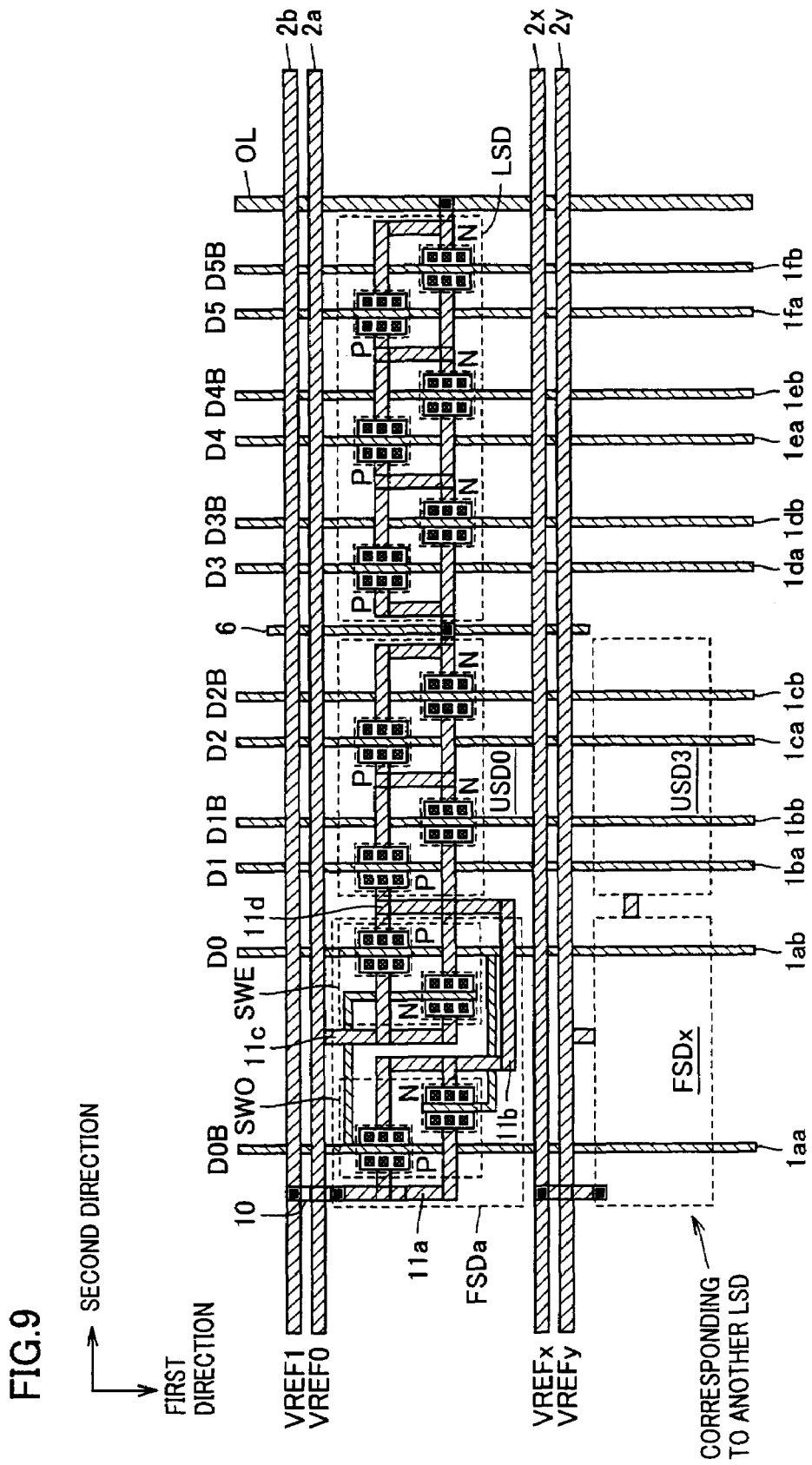
FIG. 9 is a diagram showing still another planar layout of the decoding circuit shown in FIG. 5.

FIG. 9 is a diagram schematically showing another interconnection layout of the decoding circuit according to Embodiment 1 of the present invention. FIG. 9 shows detailed arrangement of a portion related to one first sub-decoding circuit FSDa. The first sub-decoding circuit FSDa is coupled to output line OL through unit decoder USD0 of the second sub-decoding circuit at the next stage and last sub-decoding circuit LSD. The connection for a first sub-decoding circuit FSDx and unit decoder USD3 of the second sub-decoding circuit at the next stage, which are provided corresponding to another last sub-decoding circuit, are schematically indicated by blocks.

Reference voltage lines 2a and 2b transmitting reference voltages VREF0 and VREF 1 corresponding to first sub-decoding circuit FSDa are arranged adjacent to one side of this first sub-decoding circuit FSDa in the first direction.

First sub-decoding circuit FSDa includes switching elements SWO and SWE as unit decoders. Switching element SWO is coupled to reference voltage line 2b transmitting reference voltage VREF1 through internal interconnection line 11a and intersection line 10. On the other hand, switching element SWE is coupled to reference voltage line 2a transmitting reference voltage VREF0 through internal interconnection line 11c. In order to prevent collision of internal interconnection lines in switching elements SWO and SWE, in switching element SWO, internal interconnection line 11b at an output portion thereof is so laid out in a U shaped form as to bypass an arrangement region of switching element SWE and is coupled to internal output line 11d. The interconnection and layout of gate electrode leading out interconnection line to control signal lines 1aa and 1ab for these switching elements SWO and SWE are the same as the arrangement previously shown in FIG. 7. The same reference numerals are allotted to the same or corresponding components to the interconnection arrangement shown in FIG. 7, and the detailed descriptions thereof will not be repeated.

First sub-decoding circuit FSDx is arranged in alignment with first sub-decoding circuit FSDa along the first direction. This first sub-decoding circuit FSDx is coupled to unit decoder USD3 of the second sub-decoding circuit. These first sub-decoding circuit FSDx and unit decoder USD3 are provided corresponding to the other last sub-decoding circuit (LSD). For first sub-decoding circuit FSDx, reference voltage lines 2x and 2y transmitting two corresponding reference voltages VREFx and VREFy are arranged adjacently, and the switching elements inside not shown are coupled to reference voltage line 2x through crossing or bridging interconnection line (10).

The arrangement order in position of bits D1, D1B to D5, D5B transmitted onto control signal lines 1ba, 1bb to 1fa, 1fb is the same as that in FIGS. 8 and 7.

The interconnection layout of first sub-decoding circuit FSDa is arranged repeatedly and duplicately along the first direction. A pair of the reference voltage lines transmitting a pair of the reference voltages which each respective first sub-decoding circuit selects are arranged on one side of each of the first sub-decoding circuits in the first direction.

In the interconnection layout shown in FIG. 9, two first sub-decoding circuits FSDa and FSDx may be arranged between reference voltage lines 2a, 2b and reference voltage lines 2x and 2y. In the case of such arrangement, reference voltage lines are arranged in units of four reference voltage lines, and two first sub-decoding circuits are arranged in alignment along the first direction between a set of four reference voltage lines and an adjacent set of four reference voltage lines.

Further, control signal lines 1aa, 1ab to 1fa, 1fb are formed of first interconnection lines in the same interconnection layer as that of the gate electrodes of the MOS transistors, and the reference voltage lines are formed of interconnection lines of a second interconnection layer upper than the layer of the first interconnection lines. However, for these control signal lines 1aa, 1ab to 1fa, 1fb, a so-called shunt structure may be employed in which the first interconnection line of the same interconnection layer as that of the gate electrodes are electrically contacted with an interconnection lines of an upper third interconnection layer at predetermined intervals.

On the contrary, the first interconnection layer may be arranged above the second interconnection layer and contacts may be provided to the gate electrodes in each of the sub-decoding circuits.

The interconnection layout shown in FIG. 9 is different from the interconnection layout shown in FIG. 7 in that the reference voltage lines transmitting the reference voltages selected by a corresponding first sub-decoding circuit are arranged adjacently, and thus, a similar effect can be obtained to the embodiment shown in FIG. 7.

As described above, according to Embodiment 1 of the present invention, in the sub-decoding circuit, which performs the 2 to 1 selection in accordance with the least significant bit, the unit decoders are arranged in parallel, so that the size of this decoding circuit in the vertical direction (first direction) in which the reference voltages of the output candidates are arranged, can be halved. Particularly, in the first bit group decoding circuit receiving the data of one bit, the unit decoders of the first sub-decoding circuit are arranged in parallel, so that the first bit group decoding circuit becomes longer only by the size of the unit decoder of one bit in the horizontal direction (second direction), and thus, the vertical size can be significantly reduced while suppressing an increase in the horizontal size.

In addition, to the output line, only the last sub-decoding circuits are connected, so that the load of the output line can be alleviated and the decoding operation can be performed at high speed to settle the output voltage at a faster timing.

Embodiment 2

Figure 10:
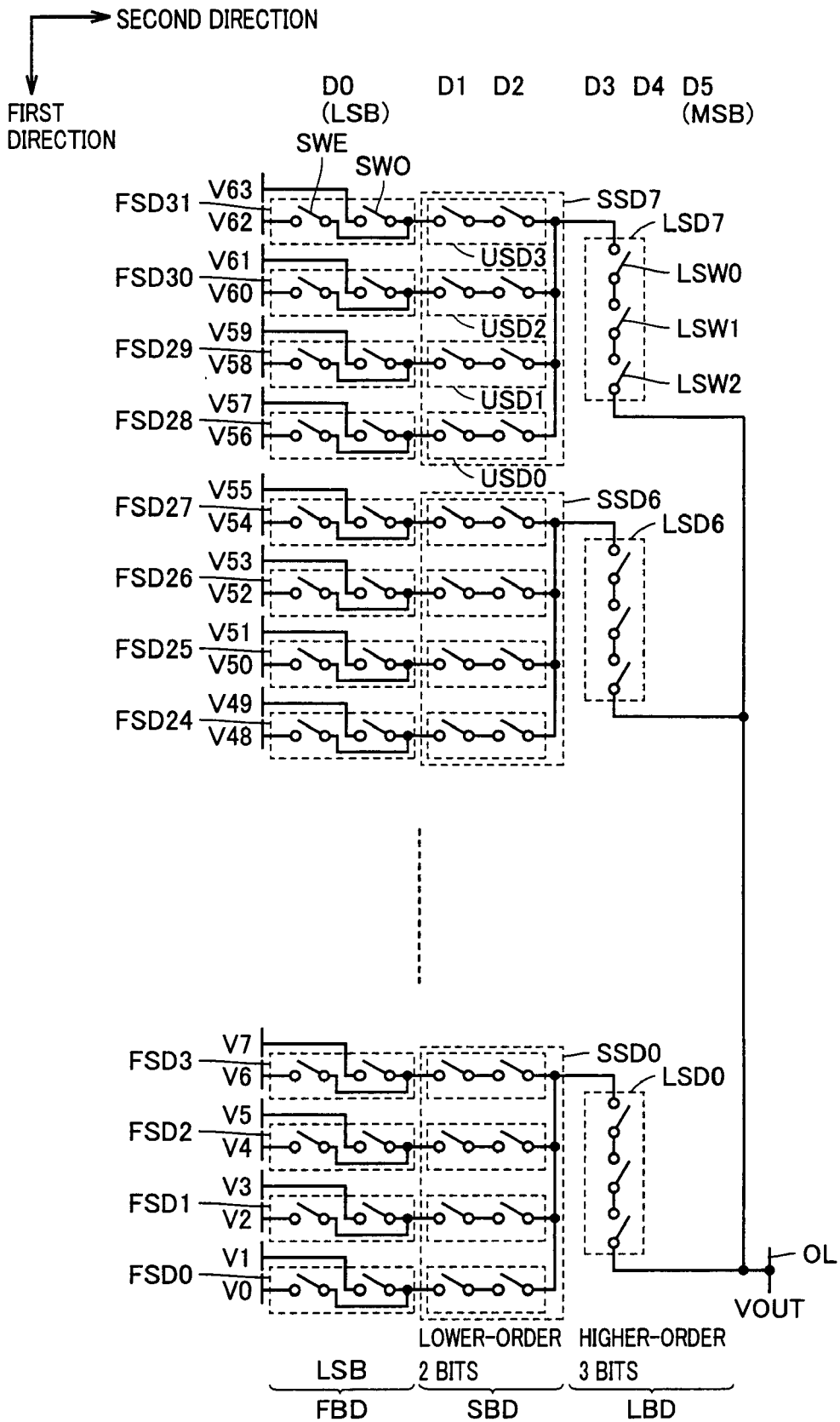
FIG. 10 is a diagram schematically showing a configuration of a decoding circuit according to Embodiment 2 of the present invention.

FIG. 10 is a diagram schematically showing a configuration of a decoding circuit according to Embodiment 2 of the present invention. The decoding circuit shown in FIG. 10 is different in configuration from the decoding circuit shown in FIG. 4 in the following point. Specifically, in the last bit group decoding circuit LBD provided for higher-order 3 bits D3 to D5, last sub-decoding circuits LSD0 to LSD7 each include a series body of switching elements LSW0 to LSW2 arranged in alignment along the first direction. Switching elements LSW2 at the last stage of the respective last sub-decoding circuits LSD7 to LSD0 are commonly coupled to output line OL. The decoding circuit shown in FIG. 10 is the same in other configuration as the decoding circuit shown in FIG. 4, and the same reference numerals are allotted to corresponding components, and detailed descriptions thereof will not be repeated.

Figure 11:
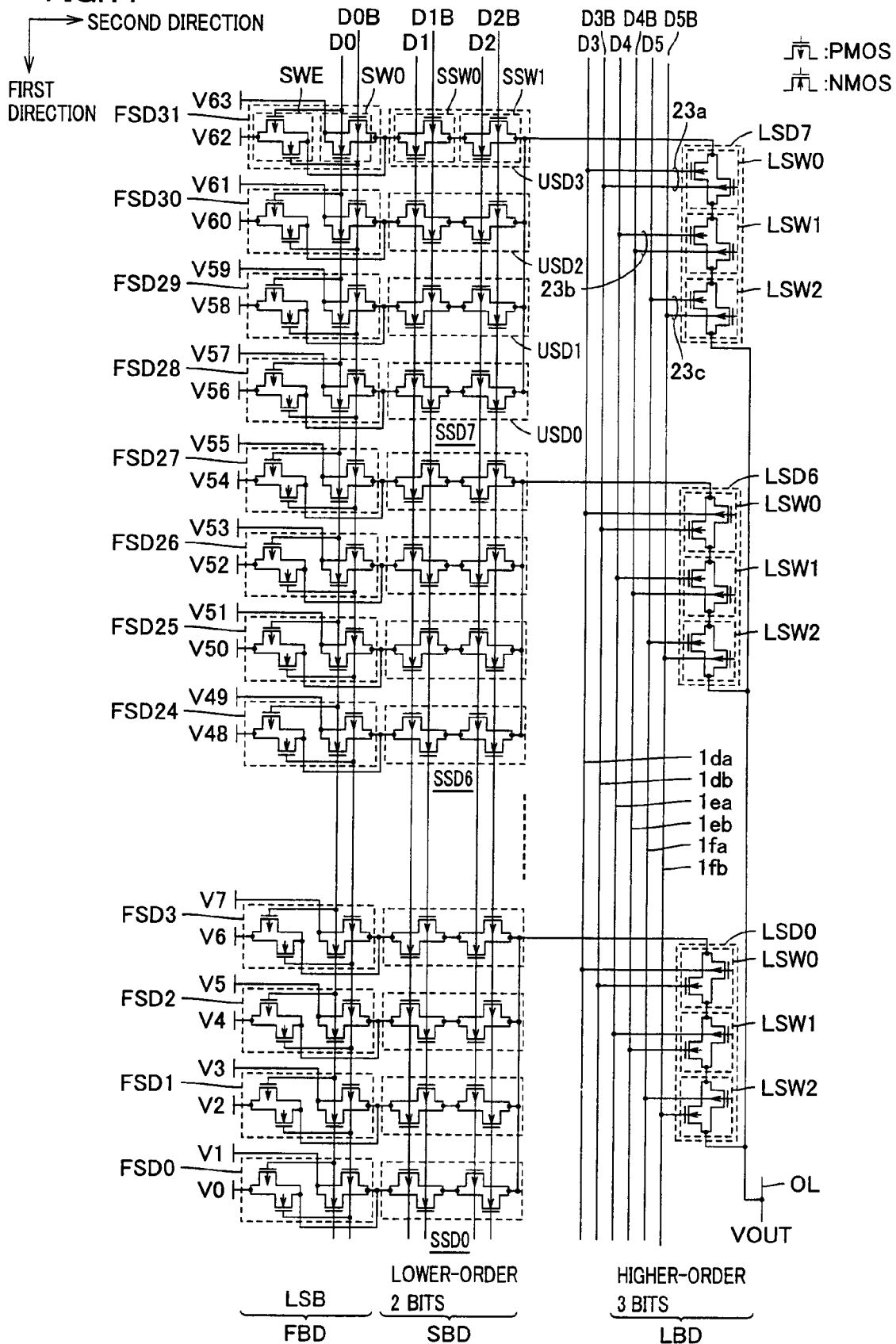
FIG. 11 is a diagram showing an array of switching elements of the decoding circuit shown in FIG. 10.

FIG. 11 is a diagram showing a specific configuration of switching elements, and specific arrangement of control signal lines in the decoding circuit shown in FIG. 10. The arrangement of the switching elements and the control signal lines shown in FIG. 11 is different from the layout of the decoding circuit shown in FIG. 5 in the following point. Control signal lines 1da, 1db to 1fa, 1fb transmitting higher-order complementary 3 bits D3, D3B to D5, D5B are disposed between second bit group decoding circuit SBD and last bit group decoding circuit LBD. Control electrodes of the switching elements (analog switches) LSW0 to LSW2 of each of last sub-decoding circuits LSD7 to LSD0 in last bit group decoding circuit LBD are coupled to the corresponding control signal lines through internal control line pairs 23a, 23b, and 23c extending in the second direction, respectively.

In the last sub-decoding circuits LSD7 to LSD0, the N channel MOS transistors are arranged in alignment along the first direction, and the P channel MOS transistors are arranged in alignment along the first direction. Since these last sub-decoding circuits LSD7 to LSD0 turn conductive in accordance with different combinations of bits D3, D3B to D5, D5B, in the switching elements (analog switches) LSW0 to LSW2, the arrangement positions of the P channel MOS transistors and the N channel MOS transistors are different. Specifically, in the last sub-decoding circuit LSD7, switching element LSW0 includes the N channel MOS transistor receiving bit D3 at a gate thereof and the P channel MOS transistor receiving inverted bit D3B at a gate thereof. Switching element LSW1 includes the N channel MOS transistor receiving bit D4 at a gate thereof, and the P channel MOS transistor receiving inverted bit D4B at a gate thereof. In switching element LSW2, the N channel MOS transistor receives bit D5 at a gate thereof, and the P channel MOS transistor receives inverted bit D5B.

In FIG. 11 also, the N channel MOS transistor is represented by an inward arrow in a substrate region and the P channel MOS transistor is represented by an outward arrow in the substrate region. In addition, the same reference numerals are allotted to components corresponding to those in the configuration of the decoding circuit shown in FIG. 5, and detailed descriptions thereof will not be repeated.

In the last sub-decoding circuit LSD6, switching element LSW0 includes the P channel MOS transistor receiving bit D3 at a gate thereof, and the N channel MOS transistor receiving inverted bit D3B at a gate thereof. In switching element LSW1, the N channel MOS transistor receives bit D4 at a gate thereof, and the P channel MOS transistor receives inverted bit D4B at a gate thereof. In switching element LSW2, the N channel MOS transistor receives bit D5 at a gate thereof, and the P channel MOS transistor receives inverted bit D5B.

In the last sub-decoding circuit LSD0, as for switching element LSW0, the P channel MOS transistor receives bit D3 at a gate thereof, and the N channel MOS transistor receives inverted bit D3B at a gate thereof. As for switching element LSW1, the P channel MOS transistor receives bit D4 at a gate thereof, and the N channel MOS transistor receives inverted bit D4B at a gate thereof. In switching element LSW2, the P channel MOS transistor receives bit D5 at a gate thereof, and the N channel MOS transistor receives inverted bit D5B.

In the last bit group decoding circuit LBD, the N channel MOS transistors are arranged in alignment along the first direction, and the P channel MOS transistors are arranged in alignment in the first direction. In the last sub-decoding circuits LSD7 to LSD0, by changing the arranging positions of the N channel MOS transistors and the P channel MOS transistors in accordance with the pattern of bits putting into a conductive state, last sub-decoding circuits LSD7 to LSD0 can be set to a conductive/nonconductive state in accordance with the logic table shown in FIG. 6, so that the decoding operation can be achieved.

As shown in FIGS. 10 and 11, last sub-decoding circuits LSD7 to LSD0 are each provided for four unit second sub-decoding circuits USD0 to USD3. Accordingly, the switching elements LSW0 to LSW2 can be arranged under a more alleviated pitch condition than the pitch condition of these unit second sub-decoding circuits USD0 to USD3, and the size in the second direction can be reduced from the size of the 3-bit decoding circuit to the size of the 1-bit decoding circuit.

Now, the following construction will be considered. Between the sub-decoding circuits at the preceding stage and the sub-decoding circuits at the subsequent stage, the sub-decoding circuits at the subsequent stage performs decoding operation of K bit(s) to select one of the outputs of (J) unit decoders in the sub-decoding circuits at the preceding stage. In this construction, if a relation of J being larger than or equal to K is satisfied, the switching elements of the components can be disposed in alignment along the first direction in the sub-decoding circuits in the subsequent stage, so that the size of the decoding circuit in the second direction can be reduced.

Accordingly, even if in the first sub-decoding circuits, the unit decoders are arranged in parallel in the second direction, resulting in an increased size in the second direction, the increase in size can be compensated for to reduce the size of the decoding circuit in the first and second directions.

Figure 12:
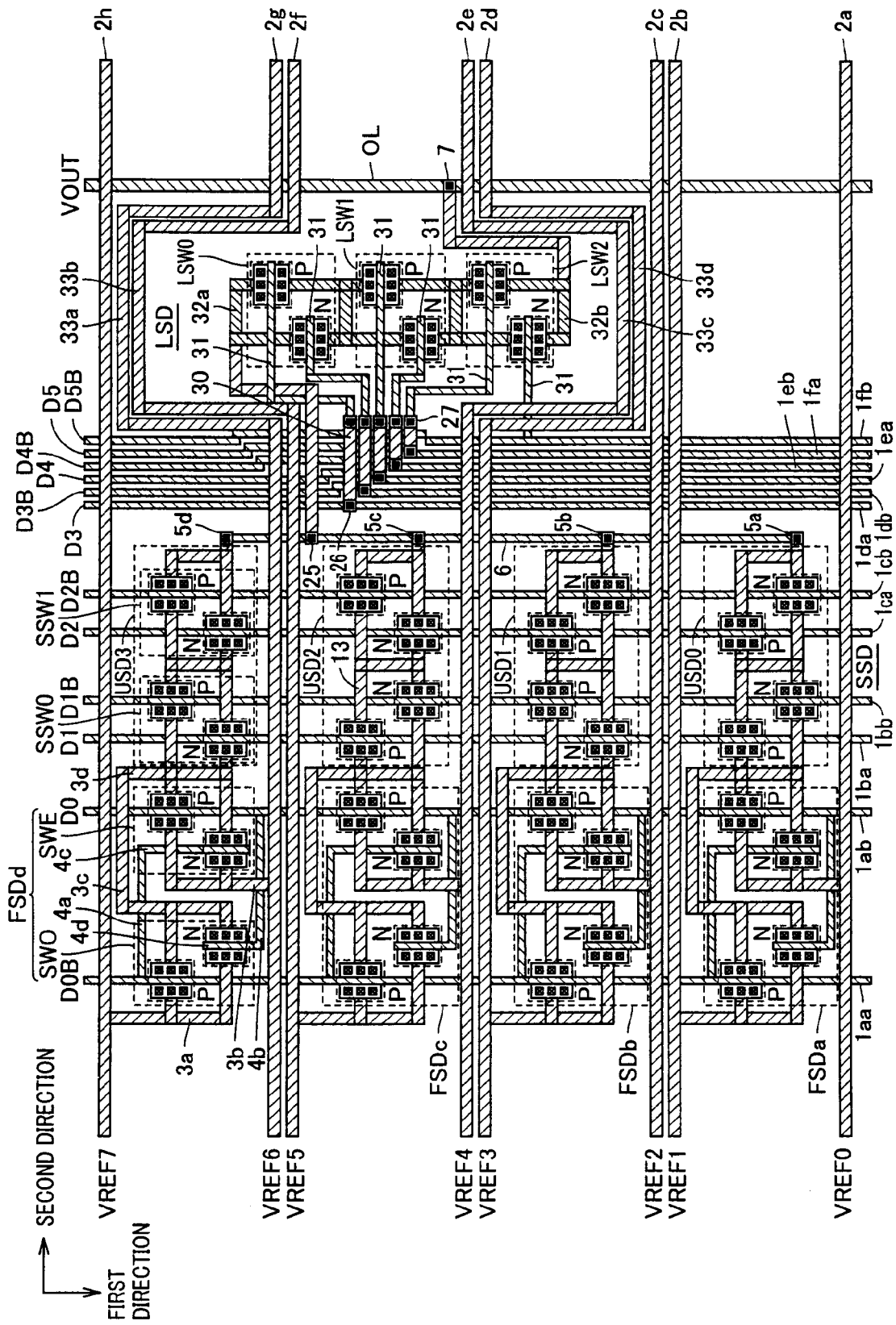
FIG. 12 is a diagram schematically showing a planar layout of the decoding circuit shown in FIGS. 10 and 11.

FIG. 12 is a diagram schematically showing a planar layout of the interconnection lines and the transistors of the decoding circuit shown in FIG. 11. In FIG. 12, similar to the layout of the interconnection and the arrangement of the decoding circuit shown in FIG. 7, a layout of the interconnection and the arrangement of components related to one last sub-decoding circuit LSD is shown. In this arrangement and interconnection layout shown in FIG. 12, the interconnection layout for last sub-decoding circuit LSD is different from the interconnection layout shown in FIG. 7, and the same reference numerals are allotted to components corresponding to those in the interconnection layout shown in FIG. 7, and the detailed descriptions thereof will not be repeated.

In FIG. 12, the P channel MOS transistors and the N channel MOS transistors constructing each of switching elements LSW0 to LSW2 composing the last sub-decoding circuit LSD are arranged in alignment along the first direction.

Control signal lines 1*da*, 1*db* to 1*fa*, 1*fb* transmitting complementary data bits D3, D3B to D5, D5B to the last sub-decoding circuit LSD are disposed between second sub-decoding circuit SSD at the preceding stage and last sub-decoding circuit LSD. Internal interconnection line 32*a* is connected through a contact 25 to vertical interconnection line 6 commonly connecting the outputs of unit decoders USD0 to USD3 of second sub-decoding circuit SSD. This internal interconnection line 32*a* is coupled to input portions of the P channel MOS transistor and the N channel MOS transistor of switching elements LSW0. Output portions of the P channel MOS transistor and the N channel MOS transistor of switching element LSW2 are coupled to output line OL through internal interconnection line 32*b* and contact 7.

In order to connect gate electrodes of the P channel MOS transistors and the N channel MOS transistors composing the switching elements LSW0 to LSW2 to the corresponding control signal lines, crossing interconnection lines 30 are provided through contacts 26 and 27, respectively. In FIG. 12, for simplification of the drawing, contacts 26 and 27 are shown for one crossing interconnection line 30. Corresponding crossing interconnection lines 30 are coupled to gate electrode lines 31 of the P channel MOS transistors and the N channel MOS transistors of switching elements LSW0 to LSW2 through contacts 27, respectively. Predetermined combinations of data bits can be transmitted to the P channel MOS transistors and the N channel MOS transistors of the corresponding switching elements LSW0 to LSW2.

In order to assure the arrangement region of this last sub-decoding circuit LSD, reference voltage lines 2*f* and 2*g* transmitting reference voltages VREF5 and VREF6 are laid out and interconnected into an inverted U-shape formed bypassing paths 33*a* and 33*b* in the arrangement region of the last sub-decoding circuit LSD, so that collision with internal interconnection lines 32*a* of this last sub-decoding circuit LSD is avoided. Similarly, reference voltage lines 2*d* and 2*e* transmitting reference voltages VREF3 and VREF4 are also interconnected to form a U-shaped form bypassing paths 33*d* and 33*c* in the arrangement region of last sub-decoding circuit LSD, so that interconnection collision for switching elements LSW1, LSW2 of this last sub-decoding circuit can be avoided.

These bypassing paths 33a to 33d are disposed to vicinities of reference voltage lines 2c and 2h transmitting reference voltages VREF7 and VREF2, respectively. Last sub-decoding circuit LSD can be interconnected and laid out within a pitch range for arranging three unit decoders (USD1 to USD3) while preventing the collision of the interconnection lines.

By disposing control signal lines 1da, 1db to 1fa, 1fb transmitting data bits D3, D3B to D5, D5B between last sub-decoding circuit LSD and second sub-decoding circuit SSD at the preceding stage, the following advantageous effect can be achieved. That is, in the case where control signal lines 1da, 1db to 1fa, 1fb are arranged adjacent to output line OL, capacitive coupling occurs between the output of each of last sub-decoding circuits LSD (LSD0 to LSD7) and control signal lines 1da, 1db to 1fa, 1fb. In the outputs of these last sub-decoding circuits, various noises due to skew of data bits D3, D3B to D5, D5B or the like are caused, resulting in various noises on output line OL through the capacitive coupling. Therefore, in a circuit at the subsequent stage receiving the output of the decoding circuit, margin against the noises needs to be assured with respect to timing for latching the output signal (voltage) of this decoding circuit. As a result, the latch timing of the output signal of the decoding circuit is delayed and thus, operation start timing in the circuit at the subsequent stage is delayed. In the case where the reference voltages are gradation voltages of an image display apparatus, an operation cycle of a latch circuit becomes longer, to make it difficult to transmit the writing voltage to pixels at high speed within a short time, and to makes the display of a high-resolution image difficult.

However, by arranging control signal lines 1da, 1db to 1fa, 1fb in the concentrated manner between second sub-decoding circuit SSD and the last sub-decoding circuit LSD, the capacitive coupling of control signal lines to the outputs of the last sub-decoding circuits can be avoided. For the latching timing of the signal on output line OL in the decoding circuit, it is sufficient to consider decoding timing of switching element LSW2 receiving the most significant bits D5, D5B of this last sub-decoding circuit LSD (the decoding timing of the most significant data bit is determined in consideration of decoding timing of the other lower-order bits, that is, reference voltage propagation delay). Accordingly, latch timing in the circuit at the subsequent stage utilizing the signal (voltage) of output line OL of the decoding circuit can be easily set, and further, the noise due to the capacitive coupling with control signal lines on this output line OL can be reduced. Accordingly, the reference voltage according to the data bits can be transmitted to the circuit at the subsequent stage precisely, and thus, precision of the decoding can be improved.

In the layout of the decoding circuit shown in FIG. 12, the last sub-decoding circuit LSD is arranged while providing a space between reference voltage lines 2e and 2f transmitting reference voltages VREF4 and VREF5. However, this last sub-decoding circuit LSD may be arranged within a space for arranging the 3-bit switching elements provided between reference voltage lines 2h and 2g transmitting reference voltages VREF7 and VREF6, respectively, between reference voltage lines 2c and 2d transmitting respective reference voltages VREF2 and VREF3, or between reference voltage lines 2a and 2b transmitting reference voltages VREF0 and VREF1.

As compared with FIG. 7, it is clear that by arranging this last sub-decoding circuit along the first direction, the size of the decoding circuit in the second direction is reduced. In this case, there can be realized a size reduction in the second direction substantially equal to that in the configuration in which unit decoders SWO and SWE are arranged corresponding to the reference voltages along the first direction in the first sub-decoding circuits FSDa and FSDd.

As the interconnection layout of the first sub-decoding circuit, any one of the interconnection layouts described in Embodiment 1 may be used.

[Modification]

Figure 13:
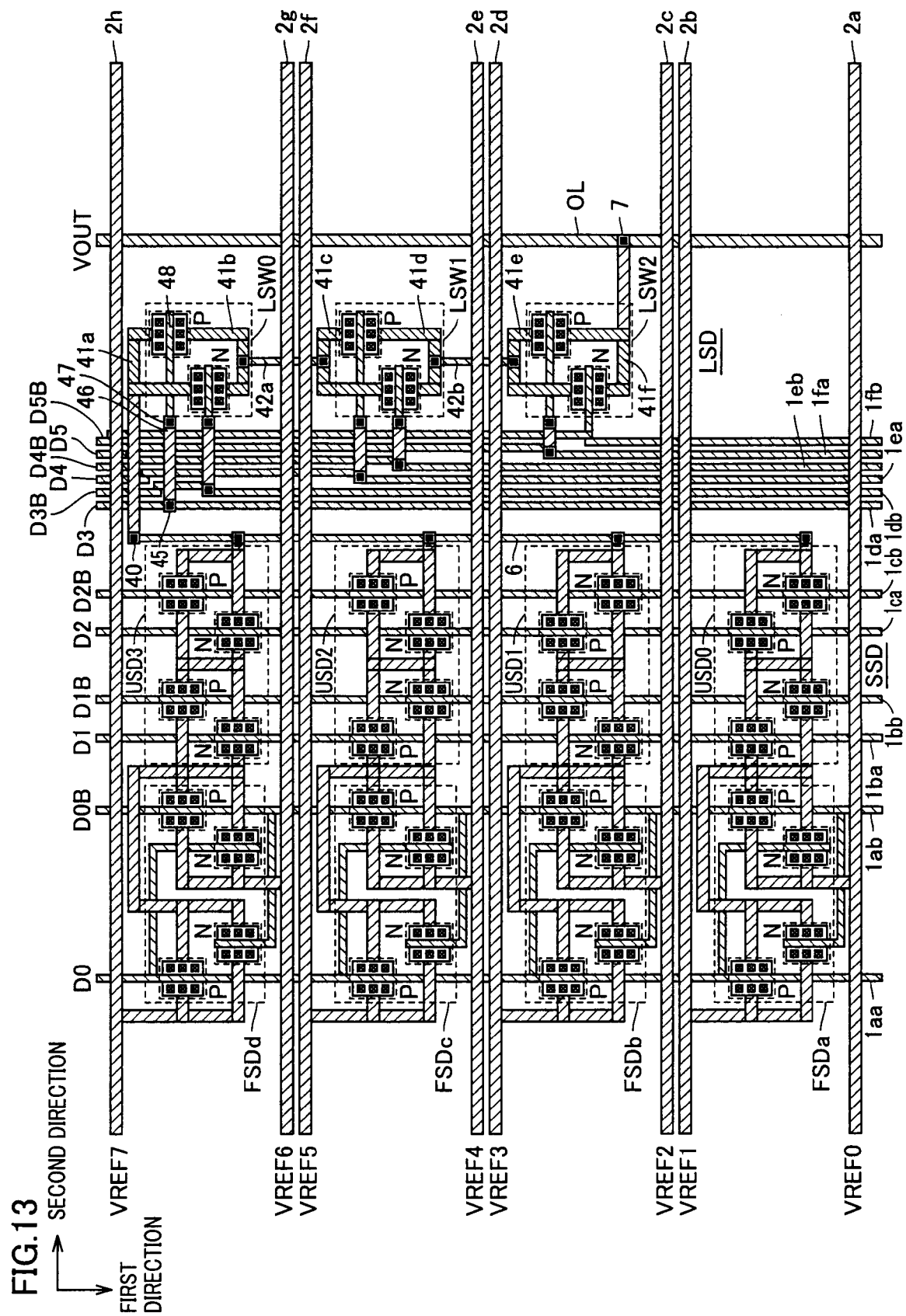
FIG. 13 is a diagram showing another example of the planar layout of the decoding circuit shown in FIGS. 10 and 11.

FIG. 13 is a diagram schematically showing arrangement and an interconnection layout of the transistors in a modification of the decoding circuit according to Embodiment 2 of the present invention. The layout of the decoding circuit shown in FIG. 13 is different from the arrangement and interconnection of the decoding circuit shown in FIG. 12 in the following point. That is, switching elements LSW0, LSW1 and LSW2 composing last sub-decoding circuit LSD are arranged individually and separately between the reference voltage lines. That is, switching element LSW0 is disposed between reference voltage lines 2h and 2g, and switching element LSW1 is disposed between reference voltage lines 2f and 2e. Switching element LSW2 is disposed between reference voltage lines 2d and 2c.

In switching element LSW0, internal interconnection line 41a connecting input portions of P and N channel MOS transistors is coupled to vertical interconnection line 6 through a contact 40, and is commonly coupled to the outputs of unit decoders USD0 to USD3 of second sub-decoding circuit SSD. Internal interconnection line 41b forming the output of switching element LSW0 is connected to internal interconnection line 41c composing an input portion of switching element LSW1 through crossing interconnection line 42a. Internal interconnection line 41d composing an output portion of switching element LSW1 is also coupled to internal interconnection line 41e on the input side of switching element LSW2 through crossing interconnection line 42b. On the output side of switching element LSW2, internal interconnection line 41f is coupled to output line OL through contact 7.

In each of switching elements LSW0 to LSW2, the input is commonly coupled to input portions of corresponding N and P channel MOS transistors, and the output is commonly coupled to the output portions of these N and P channels OS transistors.

Gate electrode interconnection lines 48 of the P channel MOS transistor and the N channel MOS transistor of each of these switching elements LSW0 to LSW2 are each coupled to a corresponding control signal line through a contact 45, crossing interconnecting line 46 and a contact 47. In FIG. 13, for simplification of the drawing, reference numerals are representatively allotted to contact 45, crossing interconnection line 46 and contact 47, and gate electrode interconnection line 47 provided for the P channel MOS transistor of the switching element LSW0. Similar reference numerals are also applied to the P channel MOS transistors and the N channel MOS transistors of other switching elements LSW1 and LSW2.

The transistor arrangement and the wiring layout of first sub-decoding circuits FSDa to FSDd and unit decoders USD0 to USD3 of second sub-decoding circuit SSD are the same as the arrangement shown in FIG. 12, and the same reference numerals are allotted to the corresponding control signals, and the detailed descriptions thereof will not be repeated.

In the arrangement of the decoding circuit shown in FIG. 13, switching elements LSW0 to LSW2 of the last sub-decoding circuit LSD are each disposed between the reference voltage lines. Therefore, there is no need to forming a bypassing path in order to provide a space for arranging the last sub-decode circuit LSD among the reference voltage lines 2c to 2g. The reference voltage lines 2c to 2g can linearly extend, which facilitates the layout of the reference voltage lines.

In addition, gate electrode interconnection lines 48 of the P channel MOS transistors and the N channel MOS transistors of switching elements LSW0 to LSW2 can be coupled to the corresponding control signal lines via the shortest distance through contacts 45 and 47 and crossing interconnection line 46, and the interconnection layout can be further simplified.

Switching elements LSW0 to LSW2 only need to be disposed between the reference voltage lines in the region where the corresponding second sub-decoding circuit SSD is arranged. For example, these switching elements LSW0 to LSW2 may be displaced by one switching element along the first direction and be disposed between the respective pairs of the reference voltage lines (e.g., switching element LSW2 is disposed between reference voltage lines 2a and 2b, switching element LSW1 is disposed between reference voltage lines 2c and 2d, and switching element LSW0 is disposed between reference voltage lines 2e and 2f).

In the interconnection layout shown in FIG. 13, a similar effect to that in the interconnection layout shown in FIG. 12 can also be achieved. That is, a decoding result can be transmitted to output line OL at a faster timing, and the decoding operation can be performed with high precision.

In Embodiment 2, the interconnection layouts of first sub-decoding circuits FSDa to FSDd as described in Embodiment 1 may be used in combination as appropriately.

For the switching elements, CMOS transmission gates (analog switches) are used to suppress an expansion of amplitude of the data bits on control signal lines 1aa, 1ab to 1fa, 1fb in the positive or negative direction. However, when the amplitude of these data bits D0, D0B to D5, D5B is sufficiently large, transfer gates each formed of an N channel MOS transistor or a P channel MOS transistor may be used. In this case, the number of elements is further reduced, and accordingly, a further reduction in size (in the first and second directions) of the decoding circuit can be achieved.

In addition, for control signal lines 1aa, 1ab to 1fa, 1fb, interconnection lines of the same layer as that of the gate electrode interconnection lines of the MOS transistors is used, and for reference voltage lines 2a to 2h, the second interconnection layer upper than this gate electrode interconnection layer is used. However, in consideration of influence of interconnection resistance and processability of manufacturing steps, for the gate electrode interconnection lines, the second interconnection layer may be used, and for reference voltage lines 2a to 2h, the first interconnection layer may be used intentionally. This relationship of the interconnection layers can also be applied in Embodiment 1.

Last sub-decoding circuit LSD, decoding more bits than the second sub-decoding circuit, can be disposed vertically. As for the number of bits of the control signal used in the decoding circuit, when the sub-decoding circuit at the subsequent stage decodes a larger number of bits than the sub-decoding circuit at the preceding stage, by disposing the sub-decoding circuit at the subsequent stage vertically, the size in the horizontal direction (second direction) can be more effectively reduced. As the number of bits to be decoded becomes increasingly larger than that of the circuit at the preceding stage, the size reducing effect in the horizontal direction by the disposal in the vertical direction becomes larger. For example, in the case where the second sub-decoding circuit decodes 3-bit data, the unit decoder is composed of a series body of three transistors. In the sub-decoding circuit at the last stage, 2-bit data is decoded in this case, and thus, the unit decoder is composed of a series body of two switching elements. In this arrangement, an increase by one bit in size in the second direction is caused in the second sub-decoding circuit. Therefore, even if the switching elements are disposed in the first direction in the last sub-decoding circuit, only the increase in size of this second sub-decoding circuit is compensated for, and the size reducing effect in the second direction as the entire decoding circuit cannot be achieved.

As described above, according to Embodiment 2 of the present invention, the sub-decoding circuit decoding a plurality of bits, particularly the sub-decoding circuit decoding more bits than that at the preceding stage is arranged in the vertical direction (first direction), which can reduce the size of the decoding circuit in the horizontal direction (second direction). In addition, a similar effect to Embodiment 1 can also be achieved.

Embodiment 3

Figure 14:
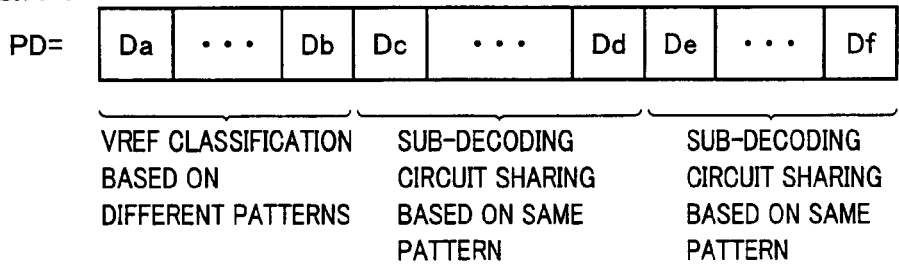
FIG. 14 is a diagram schematically showing a configuring procedure of the sub-decoding circuits of the decoding circuit according to the present invention.

FIG. 14 is a diagram showing a conceptual configuration for divided arrangement into the sub-decoding circuits of the decoding circuit according to the present invention. In FIG. 14, the data PD to be decoded has bits Da to Df. For example, in the case where decoding is performed over three stages, in the bits Da to Db, the output candidates (reference voltages) VREF are classified by different bit patterns. Subsequently, in bits Dc to Dd, the sub-decoding circuit is shared for the output candidates for the same bit pattern of bits Dc and Dd. Furthermore, in bits De to Df, the sub-decoding circuit is shared for output candidates (reference voltages VREF) corresponding to the same bit pattern. Through sharing of the sub-decoding circuits, the number of the sub-decoding circuits can be reduced in each of the second bit group decoding circuit and the third bit group decoding circuit. According to this division procedure, in above-described Embodiments 1 and 2, the sharing of the sub-decoding circuits is achieved.

Figure 15:
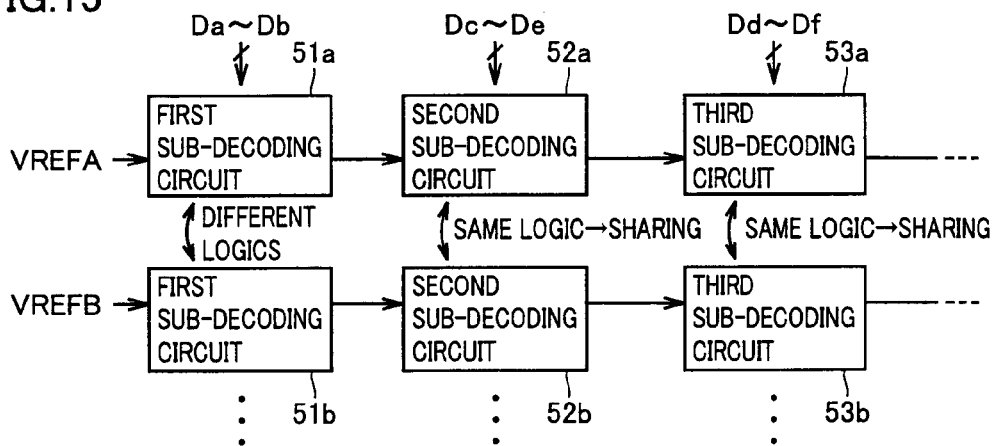
FIG. 15 is a diagram showing first step of the configuring procedure of the sub-decoding circuits shown in FIG. 14.
Figure 16:
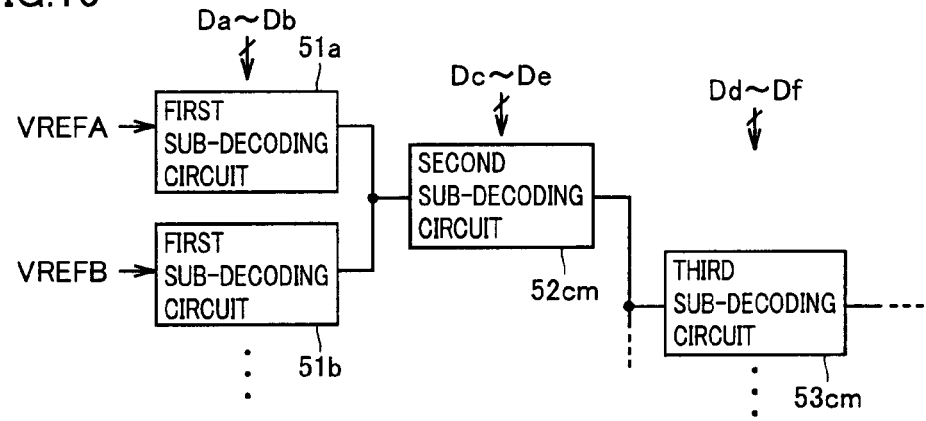
FIG. 16 is a diagram schematically showing the arrangement of sub-decoding circuits after sharing processing is performed on the sub-decoding circuits shown in FIG. 15.

FIGS. 15 and 16 are diagrams showing one example of the procedure of the sharing of the sub-decoding circuits in accordance with the bit patterns shown in FIG. 14. In FIG. 15, for simplification, the arrangement procedure of the sub-decoding circuits for two reference voltages (output candidates) is shown. In FIG. 15, a state is considered in which for a reference voltage VREFA, a first sub-decoding circuit 51a, a second sub-decoding circuit 52a, and a third sub-decoding circuit 53a are provided, and for a reference voltage VREFB, a first sub-decoding circuit 51b, a second sub-decoding circuit 52b, and a third sub-decoding circuit 53b are provided. Bits Da to Db are commonly applied to first sub-decoding circuits 51a and 51b. Bits Dc to De are commonly applied to second sub-decoding circuits 52a and 52b. Bits Dd to Df are commonly applied to third sub-decoding circuits 53a and 53b.

In first sub-decoding circuits 51a and 51b, the decoding operation is performed in accordance with the different logical value patterns of bits Da to Db, to classify reference voltages VREFA and VREFB. Second sub-decoding circuits 52a and 52b perform the decoding operation of the same logic (are set into a selected state by the same bit pattern), to communize these second sub-decoding circuits 52a and 52b into one circuit. Since third sub-decoding circuits 53a and 53b also perform the decoding operation with the same pattern of bits De to Df, they are shared.

Accordingly, in this case, as shown in FIG. 16, the second sub-decoding circuits 52a and 52b are comprised of a common second sub-decoding circuit 52cm, and the outputs of first sub-decoding circuits 51a and 51b are coupled to second sub-decoding circuit 52cm. Third sub-decoding circuits 53a and 53b are shared by a third sub-decoding circuit 53cm. For common second sub-decoding circuits 52cm . . . for which bits Dd to Df are the same pattern, the third sub-decoding circuit 53cm is commonly provided.

In the above-described Embodiments 1 and 2, in first sub-decoding circuits 51a and 51b, the classification of the output candidates is performed by the least significant bit (D0). However, the bit by which the classification of the output candidates is performed at the first stage is not limited to the least significant bit.

Figure 17:
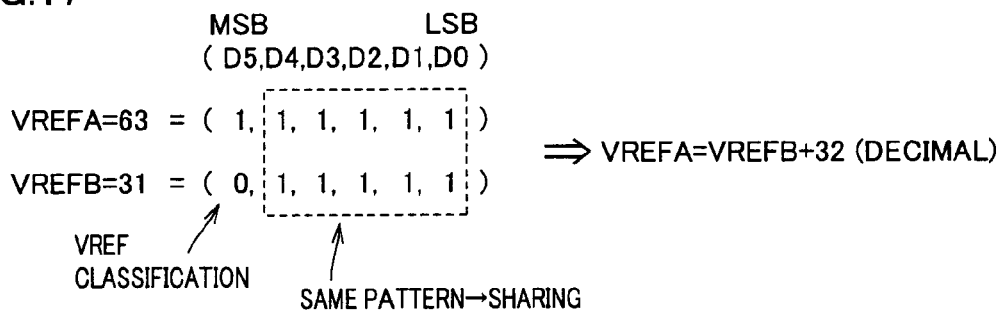
FIG. 17 is a diagram schematically showing relations between data bits and sub-decoding circuits according to Embodiment 3.

Now, a case is considered where data is composed of bits D5 to D0 as shown in FIG. 17. Bit D5 is the most significant bit (MSB) and bit D0 is the least significant bit (LSB). In this case, values in which 5 bits D4 to D0 other than bit D5 have the same bit pattern are 63 (decimal) and 31 (decimal). Similarly, 32+A (decimal) and A (decimal) are the same in the bit pattern of lower-order 5 bits D4 to D0. Accordingly, in the case where the classification of output candidates VREF is performed by the most significant bit D5, the bit pattern is the same in the lower-order 5 bits, and the sub-decoding circuit can be shared.

FIG. 18 is a diagram showing a list of logics of data bits in which each of the sub-decoding circuits of the decoding circuit according to Embodiment 3 of the present invention is turned into a conductive state. One of reference voltages V0 to V63 of the output candidates is selected in accordance with 6 bits D0 to D5. In first bit group decoding circuit FBD, reference voltages V0 to V63 are first classified in accordance with the most significant bit (MSB) D5. Lower-order bits D0 and D1 are decoded in second bit group decoding circuit SBD, and the decoding in accordance with the remaining higher-order 3 bits D2 to D4 is performed by last bit group decoding circuit LBD. The use of higher-order bits D2 to D4 in last bit group decoding circuit LBD reduces the number of the last sub-decoding circuits LSD.

In this logic configuration, in first sub-decoding circuits FSD, one of a pair of output candidates in which lower-order 5 bits D4 to D0 are in the same bit pattern is selected. Accordingly, in each of the pairs of (V63, V31), (V62, V30), ... (VA, V(A+32)), one reference voltage (output candidate) is selected by the first bit group decoding circuit FBD.

In the second bit group circuit SBD, second sub-decoding circuits SSD each include four unit decoders USD provided corresponding to the respective first sub-decoding circuits FSD. In one of second sub-decoding circuits SSD, the output of one of the first sub-decoding circuits FSD is selected in accordance with the different bit patterns of 2 bits D0 and D1 by a group of four unit decoders USD.

One last sub-decoding circuit LSD is provided for each second sub-decoding circuit SSD, that is, a group of four unit decoders USD, and one of eight last sub-decoding circuits LSD terns conductive in accordance with the pattern of bits D2 to D4, to generate a last output signal.

In the logic of the decoding circuit shown in FIG. 18, the classification of the reference voltages (output candidates) is performed by the most significant bit MSB, which is different from the above-described Embodiments 1 and 2. Accordingly, while in Embodiment 3 of the present invention, the disposing positions of reference voltages V0 to V63 are different from those of the above-described Embodiments 1 and 2, the decoding operation itself is the same as that of Embodiments 1 and 2.

Figure 19:
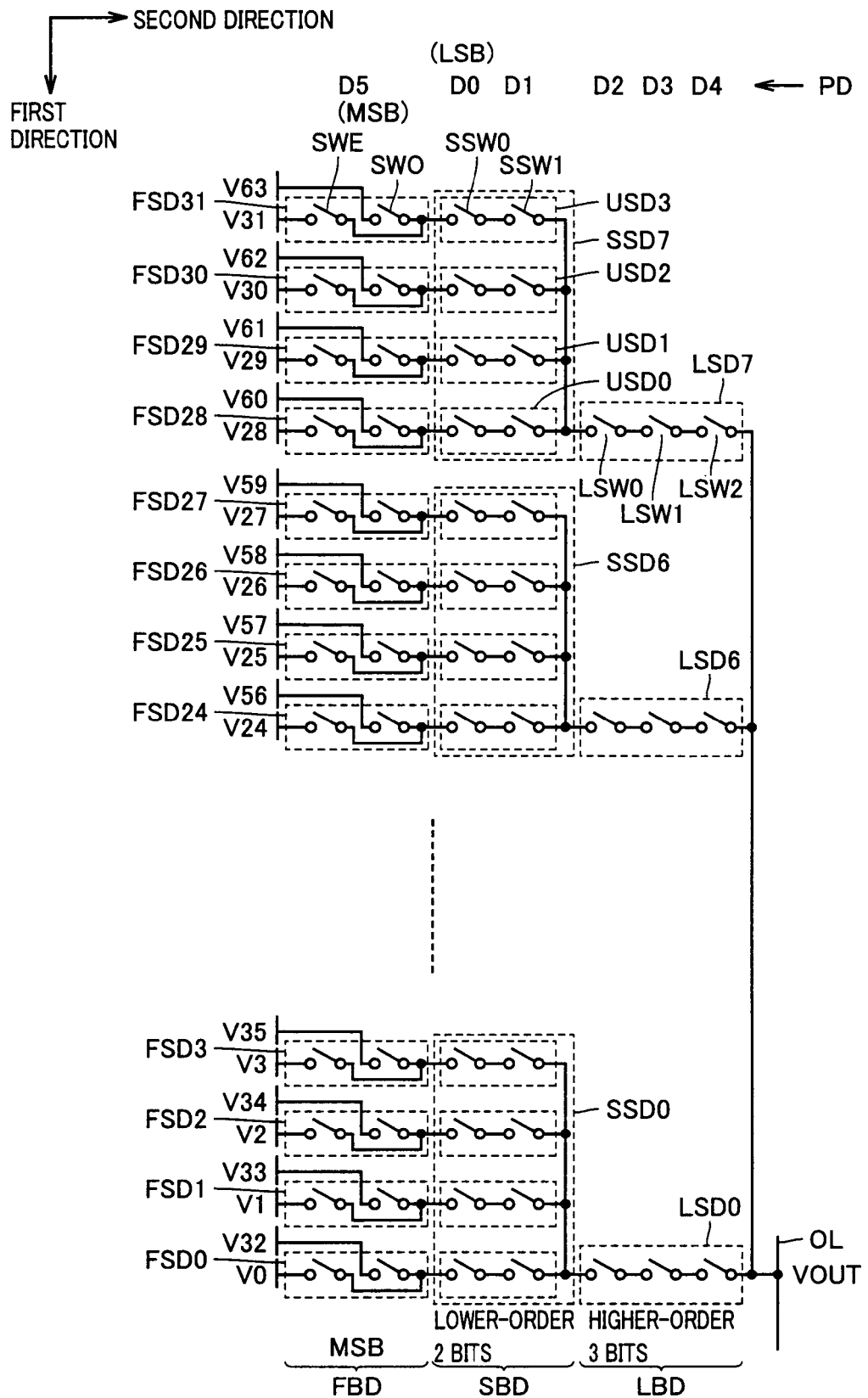
FIG. 19 is a diagram schematically showing a configuration of the decoding circuit implementing the logic shown in FIG. 18.

FIG. 19 is a diagram schematically showing a configuration of the decoding circuit achieving the logic shown in FIG. 18. The array of switching elements of the decoding circuit shown in FIG. 19 is substantially the same as the array of the switching elements of the decoding circuit according to Embodiment 1 shown in FIG. 4, and the arrangement order of the bits of data PD and the arrangement order of reference voltages V0 to V63 are different. That is, the most significant bit (MSB) D5 of data PD is commonly applied to each of first sub-decoding circuits FSD0 to FSD31 of first bit group decoding circuit FBD. In second bit group decoding circuit SBD, bits D0 and D1 are commonly applied to second sub-decoding circuits SSD0 to SSD7. In last bit group decoding circuit LBD, bits D2 to D4 are commonly applied to last sub-decoding circuits LSD0 to LSD7.

On the other hand, the reference voltages of a group of reference voltages V32 to V63 and the reference voltages of a group of reference voltages V0 to V31 are arranged alternately along the first direction. In each of first sub-decoding circuits FSD0 to FSD31, switching elements SWE and SWO each constructing the unit decoder are arranged in alignment along the second direction.

The configuration itself of the decoding circuit shown in FIG. 19 is the same as that of the decoding circuit shown in FIG. 4, and the same reference numerals are allotted to corresponding parts, and the detailed descriptions will not be repeated. The decoding operation as well as action and advantageous effect are the same as those of the decoding circuit shown in FIG. 4 according to Embodiment 1, although the logic is different.

Figure 20:
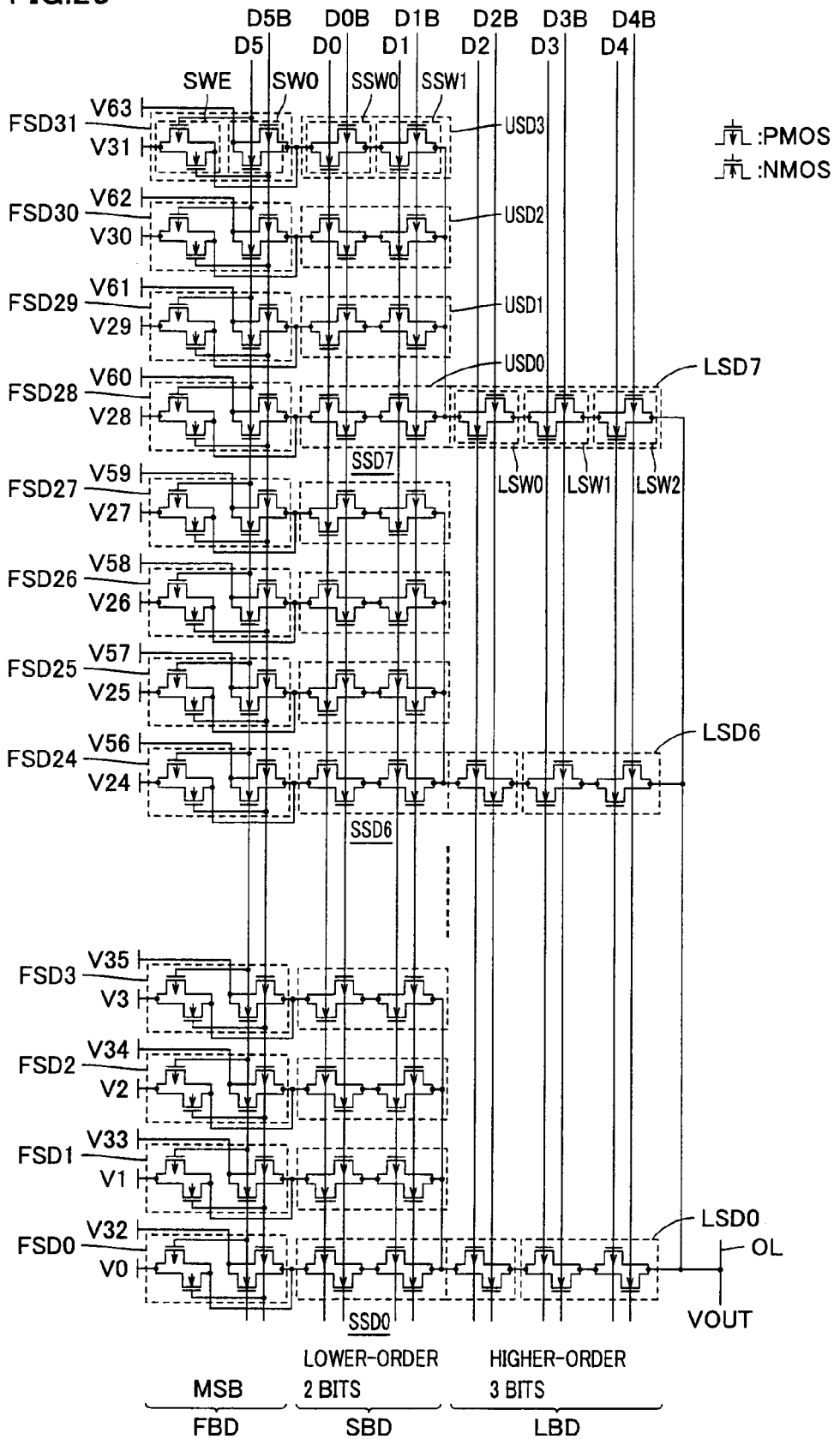
FIG. 20 is a diagram showing one example of an array of the switching elements of the decoding circuit shown in FIG. 19.

FIG. 20 is a diagram showing the arrangement of the switching elements of the decoding circuit shown in FIG. 19, in which the switching elements are each composed of a CMOS transmission gate (analog switch). In this configuration of the decoding circuit shown in FIG. 20 also, only the arranging order of reference voltages V0 to V63 and the arranging order of data bits D0, D0B to D5, D5B are different from the arrangement of the decoding circuit shown in FIG. 5, and the configuration itself of the decoding circuit is the same as the configuration of the decoding circuit shown in FIG. 5, so that the same reference numerals are allotted to corresponding parts, and the detailed descriptions thereof will not be repeated.

As shown in FIGS. 19 and 20, the reference voltages of the output candidates are classified in accordance with the most significant bit (MSB), and the sub-decoding circuits of the same logic are shared in the bit group decoding circuit at a subsequent stage, and parasitic capacitance associated with output line OL can be reduced to achieve the high-speed decoding operation as in Embodiments 1 and 2.

As the interconnection layout of the decoding circuit as shown in FIGS. 19 and 20, any one of the interconnection layouts previously shown in FIGS. 7 to 9 can be utilized. Only the bit position of the data and the arrangement of the reference voltages are different, and the interconnection layout of the switching elements and the control signal lines of the decoding circuit according to Embodiment 3 is similar to those in Embodiment 1, and the detailed descriptions thereof will not be repeated here.

[Modification]

Figure 21:
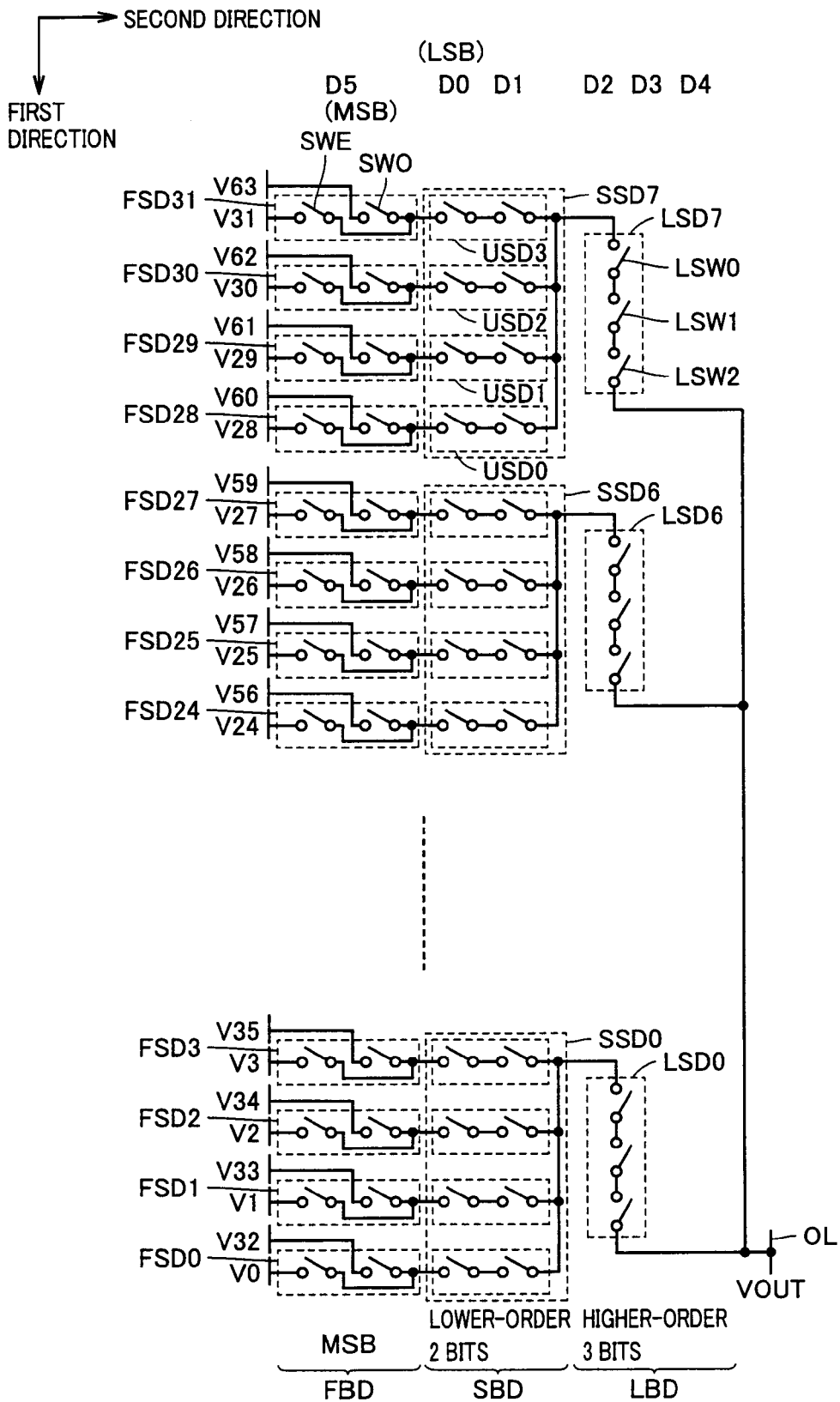
FIG. 21 is a diagram schematically showing a configuration of a decoding circuit according to a modification of Embodiment 3 of the present invention.

FIG. 21 is a diagram schematically showing the arrangement of the switching elements of a modification of the decoding circuit according to Embodiment 3 of the present invention. The decoding circuit shown in FIG. 21 is different in configuration from the decoding circuit shown in FIG. 19 in the following point. That is, in last bit group decoding circuit LBD, switching elements LSW0 to LSW2 of each of last sub-decoding circuits LSD0 to LSD7 are arranged along the first direction. The other configuration of the decoding circuit shown in FIG. 21 is the same as the configuration of the decoding circuit shown in FIG. 19, and the same reference numerals are allotted to corresponding parts, and the detailed descriptions thereof will not be repeated.

The configuration of the decoding circuit shown in FIG. 21, which is substantially different from the decoding circuit shown in FIG. 10 (Embodiment 2) in only the arranging order of the reference voltages and the arranging order of the data bits D0 to D5 are, similar action and effect (size reduction and alleviation of load on the output line) can be achieved.

Figure 22:
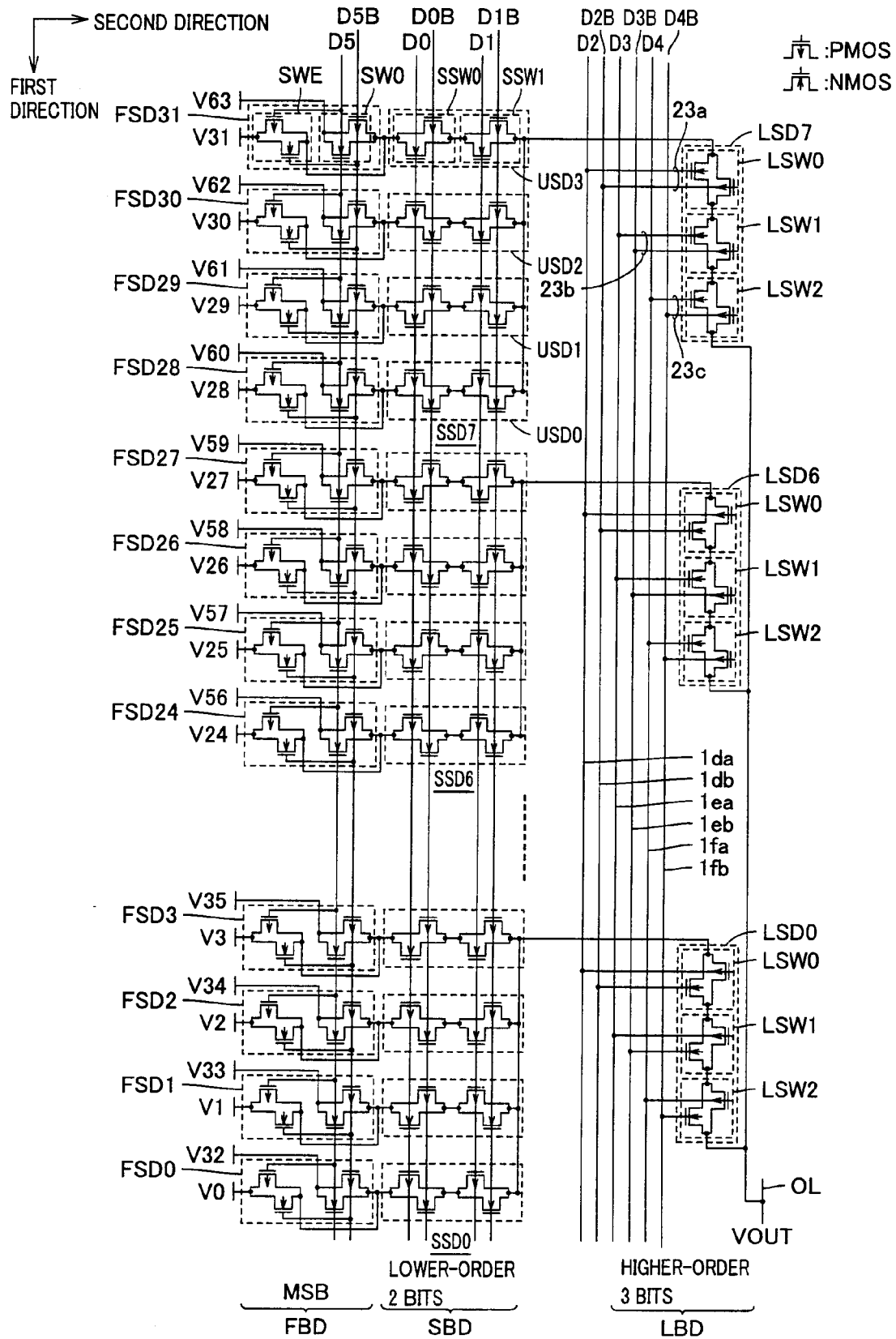
FIG. 22 is a diagram showing an array of the switching elements of the decoding circuit shown in FIG. 21.

FIG. 22 is a diagram specifically showing the switching elements of the decoding circuit shown in FIG. 21. The switching elements in the decoding circuit shown in FIG. 22 are each composed of a CMOS transmission gate. The configuration of the decoding circuit shown in FIG. 22 is the same as that of the decoding circuit shown in FIG. 20, except for that switching elements LSW0 to LSW2 are arranged along the first direction in sub-decoding circuits LSD0 to LSD7 of the last bit group decoding circuit LBD and that the control signal lines transmitting data bits D2, D2B to D4, D4B are arranged between second bit group decoding circuit SBD and last bit group decoding circuit LBD. Thus, the same reference numerals are allotted to corresponding components, and the detailed descriptions thereof will not be repeated.

The arrangement itself of the switching elements of the decoding circuit shown in FIG. 22 is the same as the decoding circuit shown in FIG. 11 (Embodiment 2). Only the arranging order of reference voltages V0 to V63 and the arranging order of data bits D0, D0B to D5, D5B are different. Thus, detailed descriptions of the configuration and operation of the decoding circuit shown in FIG. 22 are not repeated.

The interconnection layout of the decoding circuit as shown in FIGS. 21 and 22 is the same as the interconnection layout shown in FIG. 12 or FIG. 13. Only the pairs of the transmitted reference voltages and the arranging order of the data bits are different. Accordingly, since by exchanging the positions of the reference voltages and data bits in the interconnection layout shown in FIG. 12 or 13, the interconnection layout of the decoding circuit shown in FIGS. 21 and 22 can be obtained, the layout is not shown here.

As shown in FIGS. 19 to 22, in Embodiment 3, the reference voltages of the output candidates are classified using the most significant bit (MSB), and the sub-decoding circuits of the same logic are shared in the remaining bit groups. A similar effect to that of Embodiments 1 and 2 can be provided only by changing the arranging order of the reference voltages of the output candidates.

Figure 23:
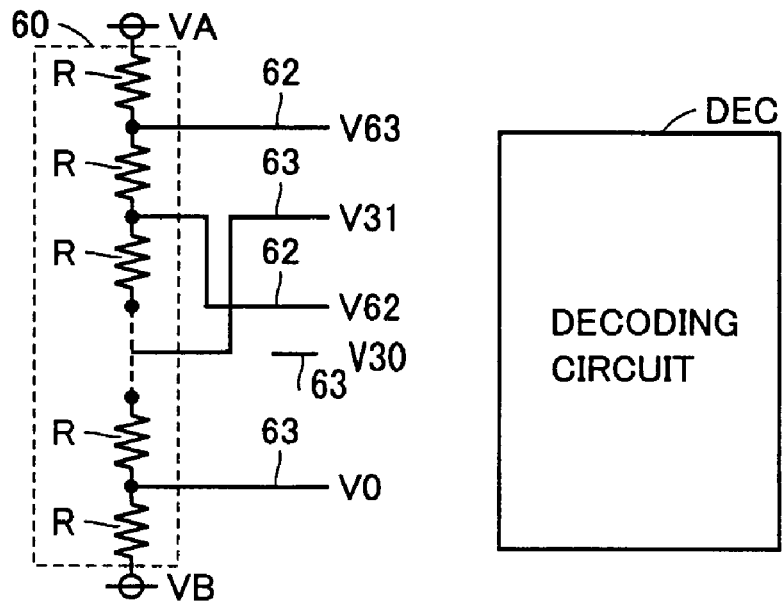
FIG. 23 is a diagram showing an example of a configuration of a reference voltage generating circuit in Embodiment 3 of the present invention.

FIG. 23 is a diagram showing an example of a configuration for generating reference voltages V63 to V0 for the decoding circuit according to Embodiment 3 of the present invention. In FIG. 23, to a decoding circuit DEC, a reference voltage generating circuit 60 for generating reference voltages V0 to V63 is provided. This reference voltage generating circuit 60 includes resistance elements R connected in series between power supply nodes VA and VB. Reference voltages V63 to V0 are generated in respective connection nodes of resistance elements R. Decoding circuit DEC has the configuration shown in any one of FIGS. 19 and 20 or FIGS. 21 and 22. The reference voltages are classified in accordance with the most significant bit. The sub-decoding circuits are so arranged as to share the sub-decoding circuits according to the bit patterns of the remaining lower-order 5 bits. One of the reference voltages is selected and outputted in accordance with the data bits.

In the case of the configuration shown in FIG. 23, in reference voltage lines 62 transmitting respective high-order reference voltages V32 to V63, and reference voltage lines 63 transmitting respective low-order reference voltages V0 to V31, high-order reference voltage lines 62 transmitting the high-order reference voltages and low-order reference voltage lines 63 transmitting the low-order reference voltages V0 to V31 are crossed, and the interconnection lines are arranged alternately such that a pair of reference voltages corresponding to a pair of data the same in lower-order 5 bit pattern is arranged adjacently, and are connected to decoding circuit DEC. In this case, reference voltage generating circuit 60 is achieved by one reference voltage generating circuit, resulting in simplified circuit configuration.

In the configuration of the reference voltage generating circuit shown in FIG. 23, resistance values of resistance elements R are all set to the same value, so that the step of the reference voltages is the same, and the gradation voltage changes linearly in accordance with the logical values of the data bits. However, the resistance values of the resistance elements may be set such that the gradation voltage changes logarithmically in accordance with the data bit values, for example.

[Reference Voltage Generating Circuit Modification 1]

Figure 24:
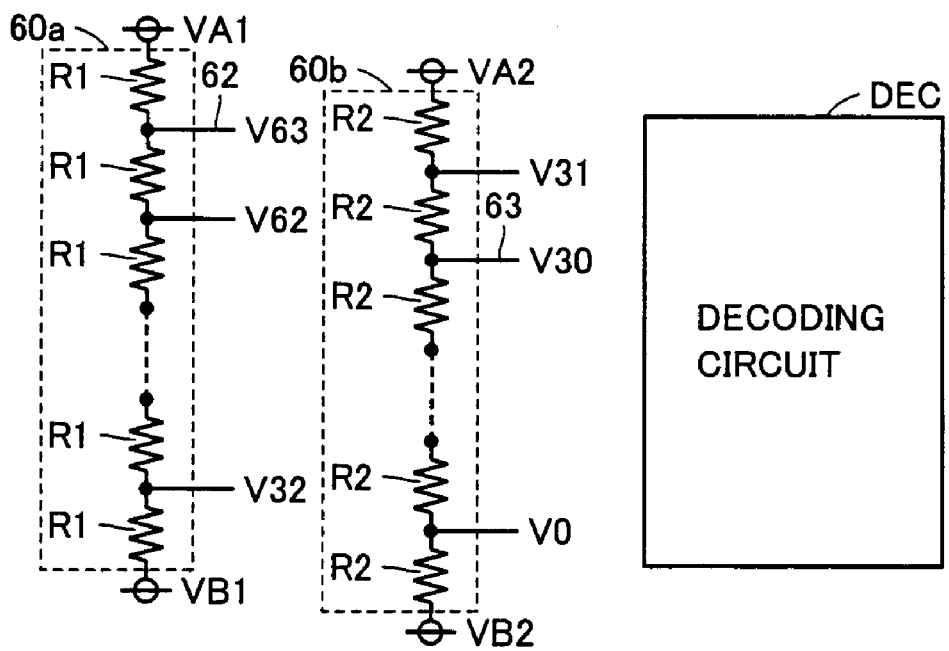
FIG. 24 is a diagram showing a modification of the arrangement of the reference voltage generating circuit in Embodiment 3 of the present invention.

FIG. 24 is a diagram showing a configuration of Modification 1 of the circuit for generating the reference voltages according to Embodiment 3 of the present invention. In FIG. 24, a reference voltage generating circuit 60a for generating high-order reference voltages V32 to V63 and a reference voltage generating circuit for 60b generating low-order reference voltages V0 to V31 are provided separately on one side of decoding circuit DEC. The reference voltage generating circuit 60a includes resistance elements R1 connected in series between power supply nodes VA1 and VB1, and reference voltage generating circuit 60b includes a series body of resistance elements R2 connected between power supply nodes VA2 and VB2. In reference voltage generating circuit 60a, reference voltages V32 to V63 are generated from the respective connection nodes of resistance elements R1, and in reference voltage generating circuit 60b, reference voltages V0 to V31 are generated from the respective connection nodes of resistance elements R2. The voltage corresponding to reference voltage V32 is applied to power supply node VB1, and the voltage corresponding to voltage V31 is applied to power supply node VA2. In the case of such configuration, resistance values of resistance elements R1 and R2 are the same, and the same configuration as that of reference voltage generating circuit 60 shown in FIG. 23 can be achieved.

In the case of the configuration shown in FIG. 24, reference voltage lines 62 and 63 from reference voltage generating circuits 60a and 60b can be extended linearly. Accordingly, no crossing between these reference voltage lines 62 and 63 are not present, and coupling noise due to capacitive coupling between the reference voltage lines can be suppressed.

[Reference Voltage Generating Circuit Modification 2]

Figure 25:
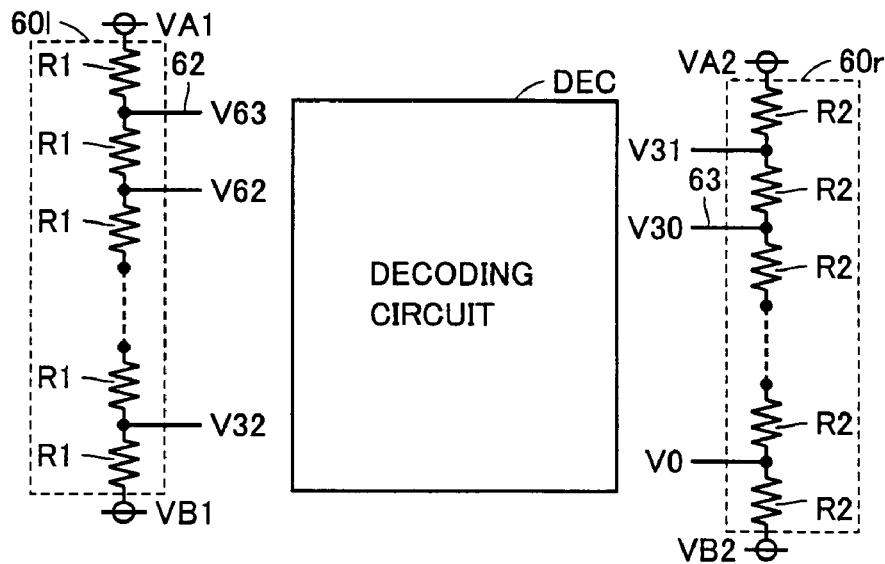
FIG. 25 is a diagram showing still another example of the arrangement of the reference voltage generating circuit in Embodiment 3 of the present invention.

FIG. 25 is a diagram showing a configuration of Modification 2 of the circuit for generating the reference voltages for the decoding circuit according to Embodiment 3 of the present invention. In the arrangement shown in FIG. 25, on both sides of decoding circuit DEC, reference voltage generating circuits 60l and 60r are arranged, respectively. Reference voltage generating circuit 60l has a similar configuration to that of reference voltage generating circuit 60a (refer to FIG. 24), and includes resistance elements R1 connected in series between power supply nodes VA1 and VB1. Reference voltage generating circuit 60r has a similar configuration to that of reference voltage generating circuit 60b, and includes resistance elements R2 connected in series between power supply nodes VA2 and VB2.

In reference voltage generating circuit 60l, high-order reference voltages V32 to V63 are generated from the respective connection nodes of resistance elements R1, and in reference voltage generating circuit 60r, low-order reference voltages V0 to V31 are outputted from the respective connection nodes of resistance elements R2. In the use of the arrangement of reference voltage generating circuits 601 and 60r shown in FIG. 25, reference voltage lines 62 and 63 can be extended linearly from both sides of decoding circuit DEC. Accordingly, the reference voltage lines can be prevented from being arranged extending over one of these reference voltage generating circuits 601 and 60r, resulting in further reduced capacitive coupling noise between reference voltage lines.

In the configuration shown in this FIG. 25 also, as an example, the voltage corresponding to reference voltage V32 is supplied to power supply node VB1, and the voltage corresponding to reference voltage V31 is supplied to power supply node VA2. To power supply nodes VA1 and VB2, the voltages of the same level as the voltages applied to the power supply nodes VA and VB of the reference voltage generating circuit shown in FIG. 23 are applied.

In the configurations of the reference voltage generating circuits shown in FIGS. 24 and 25, the voltages applied to power supply nodes VB1 and VB2 are sufficient to be generated through resistance division of the voltages applied to power supply nodes VA1 and VB2.

In the configurations of the reference voltage generating circuits shown in FIGS. 24 and 25, resistance values of the resistance elements of the components are the same in the description. However, in the case where the reference voltages are used as gradation voltages of an image display apparatus, the resistance values may be adjusted such that the step of this reference voltages changes logarithmically.

In addition, in the case where decoding circuit DEC is used in an image display apparatus, and reference voltages V0 to V63 are used as the gradation voltages for pixel writing, the voltage polarities between power supply nodes VA and VB, between power supply nodes VA1 and VB1, and between power supply nodes VA2 and VB2 are changed every scan line in accordance with a negative polarity mode and a positive polarity mode. In the case where the polarity of writing voltage of adjacent pixels in pixels on one scan line is changed into positive polarity and negative polarity alternately, in decoding circuits provided corresponding to data lines of a pixel array, the voltage polarity is inverted for each pixel column, and applied to each respective decoding circuit. In the case where writing voltages for two pixel columns are generated from one decoding circuit DEC, the voltage polarity only needs to be switched for each pixel sampling period.

Switching of the voltage polarity is performed in accordance with an appropriate method, depending on an AC driving method of liquid crystal pixel elements and a configuration of a pixel driving circuit. For example, the voltage polarity of power supply nodes VA and VB or VA1 and VB1, or VA2 and VB2 of this reference voltage generating circuit is changed by switching of a power supplying path using a switching element or the like.

Figure 26:
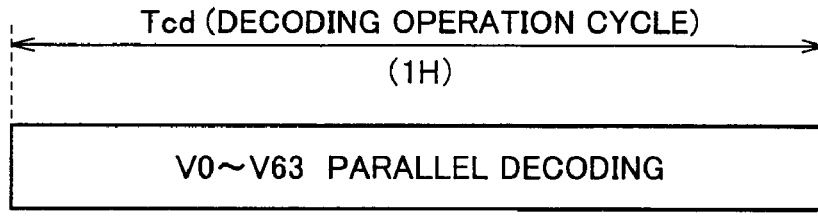
FIG. 26 is a diagram schematically showing a decoding sequence when the reference voltage generating circuits of FIGS. 24 and 25 are used.

FIG. 26 is a diagram schematically representing decoding timing in the case where the two reference voltage generating circuits shown in FIG. 24 or 25 are utilized. In the decoding timing shown in FIG. 26, the decoding operation is performed in parallel for reference voltages V0 to V63 from the two reference voltage generating circuits in one decoding operation cycle Tcd. Accordingly, in this case, the decoding operation is performed in accordance with the data bits, e.g., bits D5 to D0 to output one of the reference voltages. Here, decoding operation cycle Tcd denotes a cycle in which the output voltage of decoding circuit DEC is generated. In the case where in the image display apparatus, this decoding circuit is utilized as a digital/analog converter to generate a gradation voltage, and in the case where the decoding circuit is provided corresponding to each pixel column, this decoding operation cycle Tcd corresponds to one horizontal scan period 1H.

Figure 27:
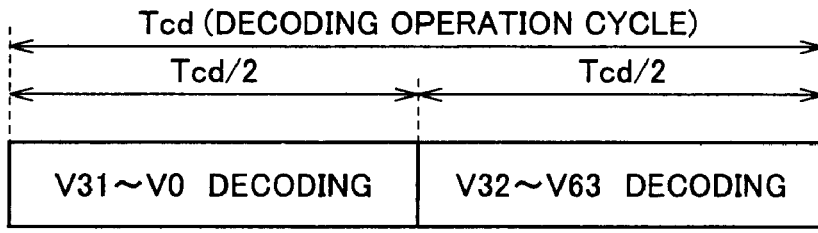
FIG. 27 is a diagram showing another example of the decoding sequence when the reference voltage generating circuits of FIGS. 24 and 25 are used.

FIG. 27 is a diagram representing another configuration of the decoding timing in the case where the two reference voltage generating circuits shown in FIG. 24 or 25 are utilized. In the decoding timing represented in FIG. 27, the decoding operation is performed for low-order reference voltages V31 to V0 in a first half cycle Tcd/2 of decoding operation cycle Tcd, and the decoding operation is performed for high-order reference voltages V32 to V63 in a second half cycle Tcd/2.

That is, as an output voltage, any one of low-order reference voltages V0 to V31 is first selected and outputted. Subsequently, in the second half cycle, the decoding operation is performed for reference voltages V32 to V63, and if any one of high-order reference voltages V32 to V63 is selected, the corresponding reference voltage is outputted. On the other hand, for example, when the data bit D5 is "1", and one of lower-order reference voltages V31 to V0 is selected, the voltage level of the output voltage is not changed from the reference voltage selected in the first half cycle. In this case, a changing amplitude of the output voltage in one decoding operation cycle is up to 32 steps. Accordingly, even if the voltage on the output line changes extremely as it changes from reference voltage V0 to reference voltage V63, an amount of changing voltage of the output line can be reduced.

In addition, in the case where the decoding circuit is utilized in an image processing apparatus, and in the case where the decoding operation is performed in accordance with all the data bits in a half cycle, the period of one decoding operation cycle Tcd needs to be assured for a changing cycle of voltage polarity.

Figure 28:
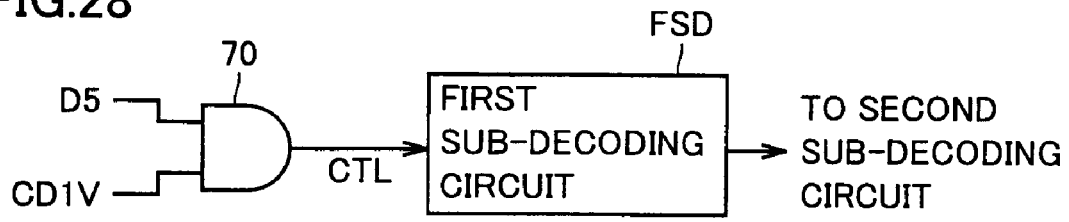
FIG. 28 is a diagram showing an example of a configuration of a decoding operation controller for achieving the decoding sequence shown in FIG. 27.

FIG. 28 is a diagram schematically showing an example of a configuration of a controller for implementing the decoding timing shown in FIG. 27. In FIG. 28, an AND circuit 70 receiving the most significant data bit D5 and a decoding control signal CDIV is provided. An output signal CTL of this AND circuit 70 is commonly applied to first sub-decoding circuits FSD, in place of bit D5. First sub-decoding circuits FSD are coupled to the input of second sub-decoding circuits at the subsequent stage. The corresponding bit group is applied to the sub-decoding circuits at the second and subsequent stages.

Figure 29:
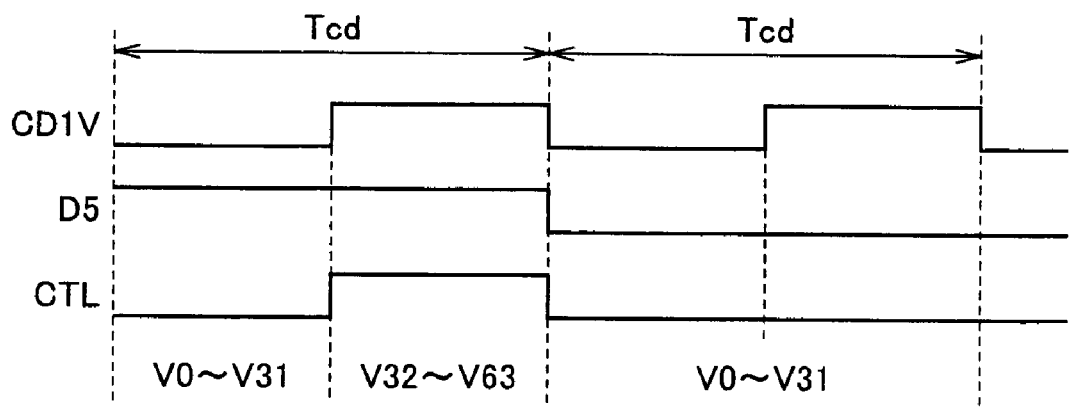
FIG. 29 is a timing chart representing an operation of the decoding operation controller shown in FIG. 28.

FIG. 29 is a timing diagram representing an operation of the driving controller shown in FIG. 28. Now, referring to FIG. 29, the operation of the decoding operation controller shown in FIG. 28 is briefly described.

In the first half cycle, decoding control signal CDIV is set to an L level, and in the second half cycle, decoding control signal CDIV is set to an H level. In this case, when the most significant bit D5 is at an H level, output signal CTL of AND circuit 70 is at an L level in the first half cycle, and at an H level in the second half cycle. Accordingly, in the first half cycle, any one of low-order reference voltages V0 to V31 is selected and outputted, and in the second half cycle, the voltage higher by 32 steps than this selected reference voltage is outputted as a decoding result.

On the other hand, when data bit D5 is at an L level, output signal CTL of AND circuit 70 is at an L level regardless of the level of the decoding control signal. Accordingly, in this case, any one of low-order reference voltages V0 to V31 is outputted as a decoding result over one decoding operation cycle.

Figure 30:
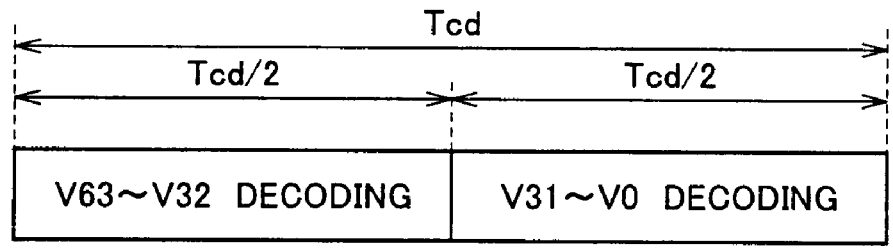
FIG. 30 is a diagram showing another example of the decoding sequence when the reference voltage generating circuits of FIGS. 24 and 25 are utilized.

FIG. 30 is a diagram schematically showing another sequence of the decoding timing in the case of the configurations utilizing the two reference voltage generating circuits shown in FIG. 24 or 25. In the decoding timing shown in FIG.

30, the decoding operation is performed for high-order reference voltages V63 to V32 in first half cycle Tcd/2 of decoding operation cycle Tcd, and the decoding operation is performed for low-order reference voltages V31 to V0 in the second half cycle Tcd/2.

In this case, in the first half cycle, one of the high-order reference voltages is selected, and subsequently, in the second half cycle, the correct reference voltage is selected. Even when the low-order reference voltage is selected, a voltage drop only by 32 steps takes place.

Figure 31:
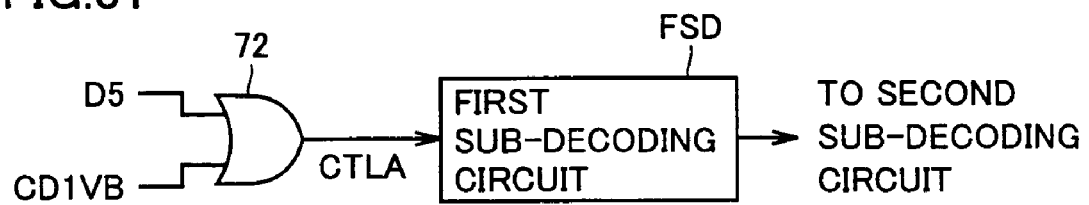
FIG. 31 is a diagram showing an example of a configuration of the decoding controller for achieving the decoding sequence shown in FIG. 30.

FIG. 31 is a diagram showing an example of a configuration of a decoding controller for implementing the decoding sequence shown in FIG. 30. In FIG. 31, an OR circuit 72 receiving the most significant data bit D5 and an inverted decoding control signal CDVIB is provided. An output signal CTLA of this OR circuit 72 is applied, in place of bit D5, to first sub-decoding circuits FSD commonly. The outputs of these first sub-decoding circuits FSD are applied to the second sub-decoding circuits, respectively. In the sub-decoding circuits of the second and subsequent bit group, the corresponding bit group is applied.

Figure 32:
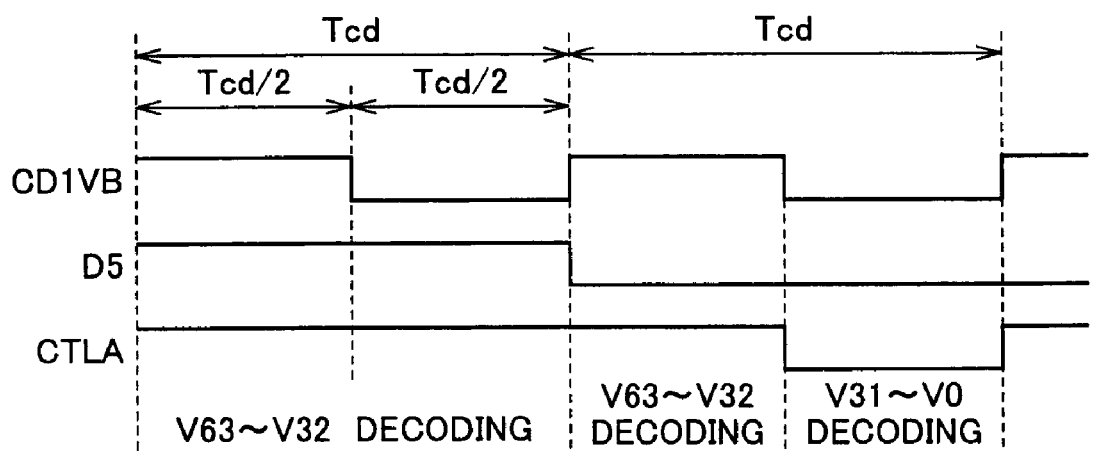
FIG. 32 is a signal timing chart representing an operation of the decoding operation controller shown in FIG. 31.

FIG. 32 is a timing diagram representing an operation of the decoding controller shown in FIG. 31. Now, referring to FIG. 32, the operation of the decoding operation controller shown in FIG. 31 is described.

In first half cycle Tcd/2 of decoding operation cycle Tcd, inverted decoding control signal CDIVB is set to an H level. When data bit D5 is at an H level, output signal CTLA of OR circuit 72 is at an H level, and in first sub-decoding circuits FSD, one of high-order reference voltages V63 to V32 is selected. In the second half cycle, even when inverted decoding control signal CDIVB attains an L level, data bit D5 is at an H level. Accordingly, output signal CTLA of OR circuit 72 is at an H level, and the high-order reference voltages are continuously outputted from first sub-decoding circuits FSD.

When Data bit D5 is at an L level, inverted decoding control signal CDIVB is turned into an H level in the first half cycle, and accordingly, output signal CTLA of OR circuit 72 attains an H level, so that one of high-order reference voltages V63 to V32 is selected in first sub-decoding circuits FSD. Subsequently, in the second half cycle, when inverted decoding control signal CDIVB attains an L level, data bit D5 remains an L level, and output signal CTLA of OR circuit 72 attains an L level. Accordingly, in first sub-decoding circuits FSD, one of low-order reference voltages V31 to V0 is selected, and the correct reference voltage according to the data bit is selected and outputted.

Thus, the decoding sequence in which the reference voltage on the high-order side is selected in the first half cycle and the reference voltage on the low-order side is selected in the second half cycle can be achieved.

By stopping the supply of power supply voltage to the reference voltage generating circuits kept unused in each half cycle, current consumption can be reduced (a voltage holding element in the output line is provided to allows the reference voltage corresponding to the data bit to be precisely transmitted to the circuit at a subsequent stage even if the power supply is stopped).

Decoding control signal CDIVB can be generated by frequency-dividing a signal defining the operation cycle of decoding circuit DEK.

In addition, this decoding operation cycle Tcd only needs to be set to an appropriate cycle depending on application in which this decoding circuit is used.

As described above, according to Embodiment 3 of the present invention, since the reference voltages of the output candidates are classified using the most significant bit, and the sub-decoding circuits are so arranged as to share the sub-decoding circuits of the same logic of the lower-order bits, as in Embodiments 1 and 2, the load of the output line can be alleviated, the number of elements can be reduced, and high-speed and high-precision decoding operation can be performed to generate the reference voltages of the output candidates.

Embodiment 4

Figure 33:
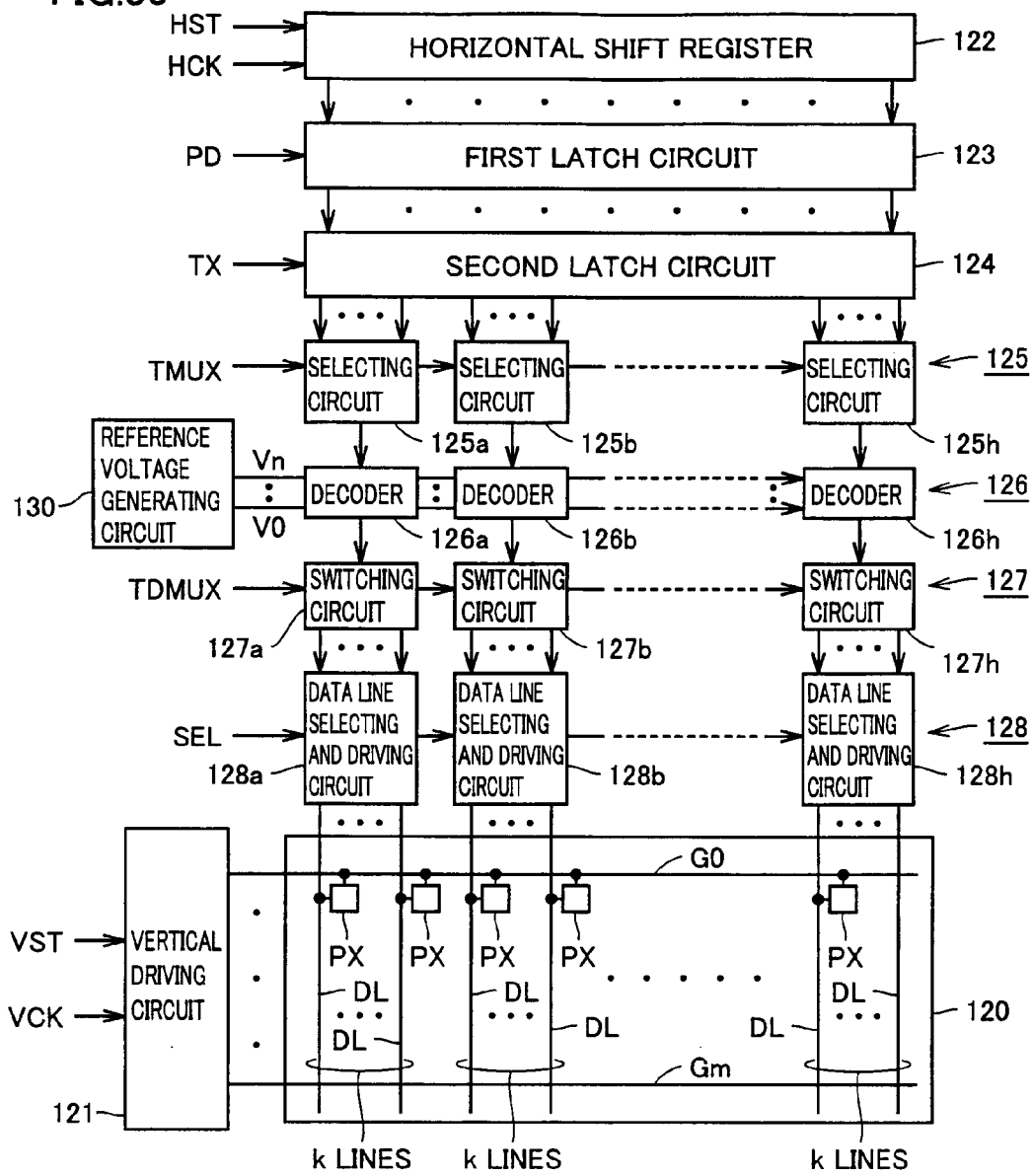
FIG. 33 is a diagram schematically showing a configuration of a main part of an image display apparatus according to Embodiment 4.

FIG. 33 is a diagram schematically showing a configuration of a display apparatus according to Embodiment 4 of the present invention. In FIG. 33, the display apparatus includes a pixel array (display panel) 120 in which pixels PX are arranged in rows and columns. In the pixel array 120, gate lines G0 to Gm are disposed corresponding to the respective rows of pixels PX, and data lines DL are arranged corresponding to the respective columns of pixels PX. In FIG. 33, pixels PX connected to gate line G0 in pixel array 120 are representatively shown. Data lines DL are grouped groups in unit of k data lines. This is because the decoding operation (digital/analog converting operation) is performed for each group of data lines as described later.

Gate lines G0 to Gm are sequentially driven to a selected state by a vertical driving circuit 121 for each horizontal scan period. A vertical-scan start instruction signal VST and a vertical shift clock signal VCK are applied to vertical driving circuit 121. Based on vertical shift clock signal VCK, a period in which each of gate lines G0 to Gm is kept in the selected state is determined.

The display apparatus further includes a horizontal shift register 122 that has outputs corresponding to the respective data lines DL, and performs shifting operation in accordance with a horizontal-scan start instruction signal HST and a horizontal shift clock signal HCK, and sequentially drives the outputs into a selected state, a first latch circuit 123 that sequentially takes in and latches multibit pixel data PD in accordance with an output signal of horizontal shift register 122, and a second latch circuit 124 that latches the pixel data latched in first latch circuit 123 in accordance with a transfer instruction signal TX.

First latch circuit 123 and second latch circuit 124 each includes latches provided corresponding to the respective data lines DL, to latch pixel data PD for the respective data lines. Second latch circuit 124 may be provided with a level shift function for signal amplitude adjustment in the decoder for performing digital/analog conversion. This level shift is performed for compensating for a difference between signal amplitude of pixel data PD and internal writing voltage amplitude to the pixels (gradation voltage amplitude on the data lines).

The display apparatus includes a frequency dividing and selecting unit 125 that sequentially selects the outputs of second latch circuit 124 in accordance with a selection control signal Tmux, a digital/analog converting unit 126 that converts the data selected in the frequency dividing and selecting unit 125 into analog data, a frequency dividing and switching unit 127 that transfers the output signal of digital/analog converting unit 126 by sequentially switching a transfer path thereof in accordance with a switching control signal TDMUX, and a data line driving unit 128 that buffers the electric signal (voltage) from frequency dividing and switching unit 127, sequentially selects data lines DL in accordance with a selection signal SEL, and drives the selected data line in accordance with the buffered signal.

Frequency dividing and selecting unit 125 includes selecting circuits 125a to 125h each provided corresponding to the respective (k) outputs of second latch circuit 124. Selecting circuits 125a to 125h operates in parallel, and sequentially select the corresponding k outputs of second latch circuit 124 in accordance with a selection signal TMUX. Selection control signal TMUX is generated by frequency-dividing horizontal shift clock signal HCK. Selecting circuits 125a to 125h each have a configuration similar to that of the shift register, and connects the k inputs to one output sequentially in accordance with selection control signal TMUX to execute k to 1 multiplexing operation.

Digital/analog converting unit 126 includes decoders 126a to 126h provided corresponding to respective selecting circuits 125a to 125h. Reference voltages V0 to Vn from a reference voltage generating circuit 130 are commonly applied to these decoders 126a to 126h (when gradation display is performed at (n+1) levels). Decoders 126a to 126h each have a configuration similar to that of any one of the decoding circuits in the previously described Embodiments 1 to 3, and select a reference voltage in accordance with pixel data (level-converted pixel data) applied from the corresponding selecting circuits 125a to 125h, thereby achieving the digital/analog conversion of the digital pixel data.

Frequency dividing and switching unit 127 includes switching circuits 127a to 127h provided for respective decoders 126a to 126h. Each of switching circuits 127a to 127h is composed of a one-input, k-output demultiplexer, and sequentially transmits, to the output thereof, the analog voltage received at the input thereof in accordance with a switching control signal TDMUX.

Data line driving unit 128 includes data line selecting and driving circuits 128a to 128h provided to respective switching circuits 127a to 127h. Each of these data line selecting and driving circuits 128a to 128h includes an analog amplifier and a data line selecting gate. The data line selecting gates are sequentially (in the case of sequential driving scheme) or simultaneously (in the case of line sequential scheme) driven to a selected state in accordance with selection signal SEL, to buffer the voltage applied from the switching circuits 127a to 127h by the internal analog amplifier and transmit the buffered voltage to data lines DL.

The analog amplifiers included in data line selecting and driving circuits 128a to 128h are each composed of, e.g., an operational amplifier (voltage follower) which receives the reference voltage transmitted to reference voltage input at a positive input thereof and feeds back the output thereof to a negative input thereof, and transmit the writing voltage (analog voltage corresponding to the selected reference voltage) to the corresponding data lines at high speed with its large driving power.

Switching circuits 127a to 127h are each composed of an analog switch, and transmit the reference voltages (analog voltages) applied from corresponding decoders 126a to 126h to the analog amplifiers of corresponding data line selecting and driving circuits 128a to 128h.

In the configuration shown in FIG. 33, since decoders 126a to 126h operate in parallel, each of the decoders 126a to 126h is required to perform the decoding operation k times in one horizontal scan period. Accordingly, the decoding operation is performed only k times in one horizontal scan period (1 H), and thus, time required for decoding (digital/analog conversion) can be sufficiently assured, and even in a high-resolution image display apparatus, the decoding operation can be reliably performed.

In addition, since decoders 126a to 126h are each composed of the decoding circuit similar to the previously described Embodiments 1 to 3, the number of the components is small, so that a sufficient layout area can be assured to arrange decoders 126a to 126h.

Figure 34:
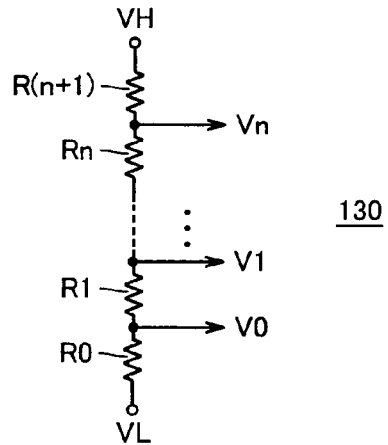
FIG. 34 is a diagram showing an example of a configuration of a reference voltage generation circuit shown in FIG. 33.

FIG. 34 is a diagram showing an example of a configuration of reference voltage generating circuit 130 shown in FIG. 33. In FIG. 34, reference voltage generating circuit 130 includes resistance elements R0 to R(n+1) connected in series between a high-side power supply node VH and a low-side power supply node VL. Reference voltages V0, V1, . . . Vn are outputted from nodes between the resistance elements. According to the reference voltage generating circuit 130, in the case where all resistance values of resistance elements R0 to R(n+1) are the same, the voltages obtained by resistance-dividing the voltage VH of the high-side power supply node and voltage VL of the low-side power supply node at the same steps are produced as the reference voltages. In place of the configuration of the reference voltage generating circuit 130 shown in FIG. 34, a configuration of a reference voltage generating circuit in which the reference voltage step changes nonlinearly or a variable-reference-voltage generating circuit in which the reference voltage step can be changed may be used.

In addition, reference voltage generating circuits 130 may be arranged separately on both sides of the decoders 126a to 126h (similarly to Embodiment 3).

Figure 35:
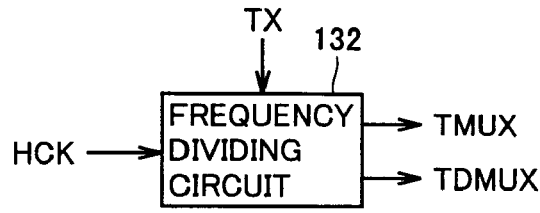
FIG. 35 is a diagram showing an example of a configuration of a part for generating a switching control signal and a selection control signal shown in FIG. 33.

FIG. 35 is a diagram schematically showing a configuration of a part for generating selection control signal TMUX and switching control signal TDMUX shown in FIG. 33. In FIG. 35, selection control signal TMUX and switching control signal TDMUX are generated by a frequency dividing circuit 132 that frequency-divides horizontal shift clock signal HCK with a predetermine period. This frequency dividing circuit 132 may generate a frequency divided signal in response to activation of transfer instruction signal TX instructing a transfer operation of the pixel data of second latch circuit 124 shown in FIG. 33. Alternatively, a configuration in which a selected position is reset to an initial position in response to the activation of transfer control signal TX in each of selecting circuits 125a to 125h may be employed. In this case, it is not particularly required that transfer instruction signal TX is applied to frequency dividing circuit 132 as a triggering signal.

Figure 36:
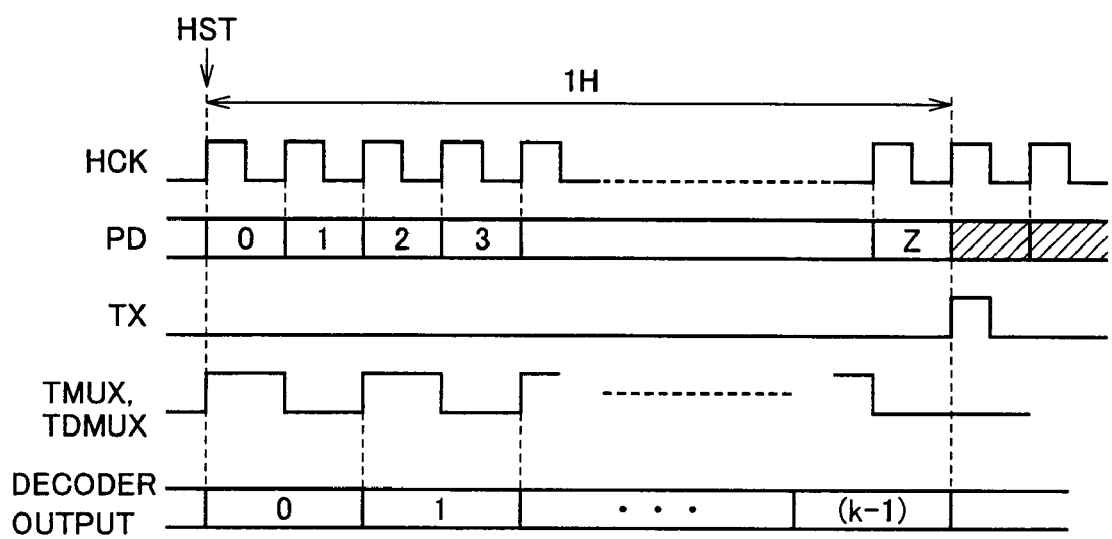
FIG. 36 is a timing chart representing a decoding operation of the display apparatus shown in FIG. 33.

FIG. 36 is a timing chart representing an operation of the display apparatus shown in FIG. 33. In FIG. 36, a waveform in the case where selection control signal TMUX and switching control signal TDMUX are generated by frequency-dividing horizontal shift clock signal HCK by a factor of two (in the case where the number of the decoders 126a to 126h is two) is shown as an example. A frequency division ratio of switching control signal TDMUX and selection control signal TMUX is determined in accordance with the number of decoders 126a to 126h (the number of decoders=frequency division ratio).

When horizontal-scan start instruction signal HST is applied, pixel data PD for the next scan line are sequentially applied. In accordance with this horizontal-scan start instruction signal HST, horizontal shift register 122 shown in FIG. 33 is initialized, and the selecting position is set to the initial position. Subsequently, horizontal shift register 122 performs shift operation starting at the initial position in accordance with horizontal shift clock signal HCK, and the latches included in first latch circuit 123 sequentially couple pixel data PD to transmission signal lines. Pixel data PD (0, . . . , z) can be transmitted in synchronization with horizontal shift clock signal HCK, to be latched by the latches inside of first latch circuit 123.

When the pixel data of the scan line is stored in first latch circuit 123, the transfer instruction signal TX is activated to transfer pixel data PD from first latch circuit 123 to second latch circuit 124.

The transferred and latched pixel data in the preceding cycle is converted into analog voltages in accordance with latched and output data of second latch circuit 124 in parallel to the latching operation on pixel data of the next scan line in first latch circuit 123. That is, selecting circuits 125a to 125h sequentially select the corresponding outputs of second latch circuit 124 in accordance with selection control signal TMUX to apply the selected output data to corresponding decoders 126a to 126h. Decoders 126a to 126h select the reference voltages in accordance with the pixel data received from selecting circuits 125a to 125h to apply the selected reference voltages to switching circuits 127a to 127h. The selection operation of the reference voltages of decoders 126a to 126h is the same as the decoding operation of the decoding circuits previously described in Embodiments 1 to 3.

Switching circuits 127a to 127h switch output paths thereof in accordance with switching control signal TDMUX to transmit the generated analog voltages (selected reference voltages) to the corresponding data line selecting and driving circuits 128a to 128h.

In data line selecting and driving circuits 128a to 128h, the analog voltages transmitted from corresponding switching circuits 127a to 127h are buffered by the analog buffer (voltage follower) to be latched. Subsequently, depending on the driving scheme of the data lines, in accordance with selection signal SEL, analog voltages (selected reference voltages) of one scan line are transmitted to corresponding data lines DL as pixel writing voltage, and are written into the pixels connected to the selected gate lines.

Decoders 126a to 126h each performs decoding operation only k times in one horizontal scan period 1H. As shown in FIG. 33, decoders 126a to 126h are each arranged corresponding to k data lines DL. Even in this case, the number of switches of the components of decoders 126a to 126h is reduced, and thus, this display apparatus driving circuit unit can be arranged with sufficient area margin.

In addition, even in the case where decoders 126a to 126h are each composed of a low-temperature polysilicon TFT as in transistors in the pixels, the load of respective output signal lines of decoders 126a to 126h is small, so that decoding operation can be performed at high speed. Further, since the number of switching elements is small, a layout area is small, so that decoders 126a to 126h can be arranged corresponding to the pitch of the k data lines with enough margin.

Furthermore, in the above description, decoders 126a to 126h are provided one for k data lines DL. Decoders 126a to 126h, however, may be arranged corresponding to each of data lines DL.

As described above, in the display apparatus according to Embodiment 4 of the present invention, since one decoder for generating the analog voltages for gradation display in the pixel array is arranged for each predetermined number of data lines, operation frequency (decoding operation times) can be reduced as compared with the case where the decoding operation of each pixel data of one scan line is performed using a single decoder, so that sufficiently long decoding time can be assured. Also, the decoders perform the decoding operation with the pixel data divided into groups, and the occupancy area is small, which can achieve a pixel driving circuit with a small occupancy area, and can achieve a driving circuit built-in display apparatus with a small occupancy area.

Pixels PX may be liquid crystal elements, or may be electroluminescence elements such as an organic EL (electroluminescence). The decoder of the present invention can be applied to the pixel in which brightness is set in accordance with the analog voltage.

[Configuration of Switching Element of Decoder]

Figure 37:
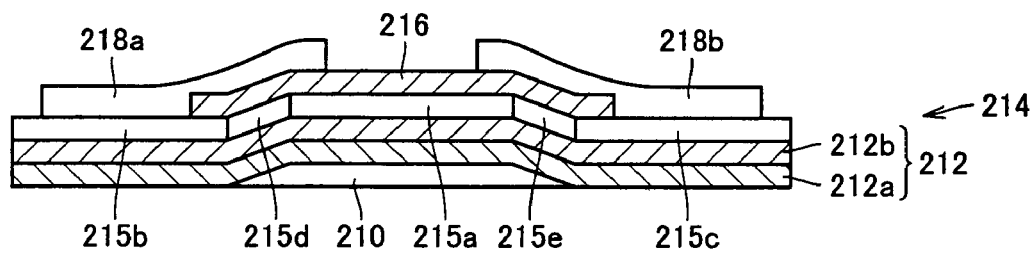
FIG. 37 is a diagram schematically showing a cross-sectional structure of the switching element used in the present invention.

FIG. 37 is a diagrams schematically showing an example of a cross-sectional structure of a MOS transistor used to compose the switching elements included in any one of decoding circuits (DEC) or the decoders (126a to 126h) according to Embodiments 1 to 3. In FIG. 37, one MOS transistor is shown. The MOS transistor is one MOS transistor of the analog switch (CMOS transmission gate), and as one example, is implemented by a bottom-gate type low-temperature polysilicon TFT (thin film transistor). The thin film transistor includes a gate electrode 210 formed on a insulating substrate, a gate insulating film 212 formed covering gate electrode 210, and a polysilicon layer 214 formed on gate insulating film 212.

Gate insulating film 212 has a multilayer film structure comprised of a first gate insulating film 212a formed of, e.g., a silicon nitride film (SiN), and a second insulating film 212b formed of, e.g., a silicon dioxide film (SiO2).

Polysilicon layer 214 includes first conductivity type high-concentration impurity regions 215b and 215c formed separately from each other, first conductivity type low-concentration impurity regions 215d and 215e formed adjacent to high-concentration impurity regions 215b and 215c, respectively, and second conductivity type body region 215a formed between these low-concentration impurity regions 215d and 215e. A channel is formed in accordance with a voltage applied to gate electrode 210, and the transistor turns into an on-state.

Gate electrode 210 is formed overlapping low-concentration impurity regions 215d and 215e and body region 215a. An interlayer insulating film 216 is formed covering the whole body region 215a and low-concentration impurity regions 215d and 215e, and covering a part of high-concentration impurity regions 215b and 215c. This interlayer insulating film 216 is formed of, e.g., a silicon dioxide film. High-concentration impurity regions 215b and 215c are connected to electrodes 218a and 218b each formed of a low resistance conductive layer. The low-concentration impurity regions 215d and 215e form a so-called LDD structure (Lightly Doped Diffusion structure) to alleviate the electric field of source/drain ends.

In the case of such TFT (thin film transistor), a foundation layer is formed of an insulating material such as a glass substrate or an epoxy substrate, and polysilicon layer 214 is formed in an intermediate layer separately from the substrate. Accordingly, as compared with a bulk type MOS transistor formed on a semiconductor substrate region, parasitic capacitance such as substrate capacitance (junction capacitance) can be reduced. In addition, reduction of film thickness of polysilicon layer 214 can reduce the height of the TFT. By utilizing the low-temperature polysilicon TFT, the decoding circuits (or decoders) can be manufactured in the same manufacturing process steps as those of pixel selecting transistors in the pixels in an image display apparatus, for example.

In this thin film transistor, electrode layers 218a and 218b are formed overlapping body region 215a, and low-concentration impurity regions 215d and 215e. Accordingly, parallel plate type capacitance is formed as parasitic capacitance when the channel is formed in body region 215a, and the parasitic capacitance is larger as compared with the case of the bulk type MOS transistor in which the junction capacitance is a main component of on-capacitance. However, in the decoding circuit according to the present invention, the number of switching elements connected to the output signal line is small, so that even if the thin film transistors (TFT) are used as components, the parasitic capacitance associated with the output signal line can be sufficiently reduced.

Further, in the case where a top gate type low-temperature polysilicon TFT in which the gate electrode is formed above body region 215*a* is used for this thin film transistor (TFT), similarly, the capacitance of an overlapping portion between the gate electrode and the source/drain electrode layers is large, so that the on-capacitance is large.

The configuration of the thin film transistor (TFT) is not limited to the configuration shown in FIG. 37, but a TFT having another configuration may be used.

The MOS transistors (TFT) shown in FIG. 37 are formed into a P channel type transistor and an N channel type transistor, to be connected to each other in parallel as shown in the interconnection layout in FIGS. 7 and 8, and others, which can implement a CMOS transmission gate (analog switch).

As described above, according to Embodiment 4 of the present invention, the decoding circuits used in any one of Embodiments 1 to 3 are utilized as the circuits for achieving digital/analog conversion of the pixel data, so that a display apparatus or a pixel array driving apparatus having decoders for performing the decoding operation at high precision and at high speed with a small occupancy area to generate gradation voltages can be achieved.

The decoding circuit according to the present invention can be utilized for a decoding circuit for selecting one of a plurality of selection candidates. In addition, the present invention can be applied to a circuit portion performing digital/analog conversion such as a reference-voltage-selecting type pixel driving circuit that generates analog voltages for gradation display in a display apparatus. Further, it can also be applied to a driving circuit built-in display apparatus with a small occupancy area in applications for portable equipment and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A decoding circuit for decoding multibit digital data having a plurality of bits, and generating an electric signal indicating a result of decoding, comprising:
   a first bit group decoding circuit provided corresponding to a first bit group having at least one bit of said multibit digital data, and decoding the at least one bit of said first bit group for selecting and producing output candidates corresponding to a decoding result from a plurality of output candidates arranged along a first direction, said first bit group decoding circuit including a plurality of first sub-decoding circuits, one arranged for each group of a predetermined number of output candidates, each commonly receiving the bit of said first bit group for selecting one output candidate from a corresponding group of output candidates, said multibit digital data being divided into a plurality of bit groups at least one of which includes a plurality of bits, said plurality of bit groups including said first bit group, bit group decoding circuits being arranged corresponding to the respective bit groups, said bit group decoding circuits including said first bit group decoding circuit, and each of said first sub-decoding circuits including a plurality of unit decoders, each provided for different output candidates, arranged in parallel along a second direction; and
   a last bit group decoding circuit provided corresponding to a last bit group of said plurality of bit groups, and commonly receiving and decoding a bit of said last bit group, said last bit group decoding circuit including a plurality of last sub-decoding circuits each arranged corresponding to each respective output of the bit group decoding circuit at a preceding stage, for selecting a corresponding output from outputs of the bit group decoding circuit at the preceding stage in accordance with the bit of said last bit group for transmitting a selected corresponding output to an output signal line.

2. The decoding circuit according to claim 1, wherein said last bit group includes a plurality of bits, and
   the last sub-decoding circuit of said last bit group decoding circuit includes a plurality of switching elements arranged corresponding to the respective bits of said last bit group and arranged along said first direction.

3. The decoding circuit according to claim 1, wherein said first bit group is composed of either one of a most significant bit and a least significant bit of said multibit digital data.

4. The decoding circuit according to claim 1, wherein
   said plurality of output candidates include a plurality of reference voltages representable by said multibit digital data,
   said plurality of reference voltages are sequentially arranged along said first direction in order of magnitude of a value of said multibit digital data, and
   the plurality of bits of said multibit digital data are divided into said plurality of bit groups along a bit position order of said plurality of bits.

5. The decoding circuit according to claim 1, wherein
   said plurality of output candidates include a plurality of reference voltages representable by said multibit digital data,
   the plurality of bits of said multibit digital data has a most significant bit assigned to said first bit group and remaining bits of said plurality of bits divided into remaining bit groups of said plurality of bit groups along a bit position order, and
   said plurality of reference voltages are sequentially arranged along said first direction in order of magnitude of a value represented by said remaining bits of said multibit digital data, and each of said first sub-decoding circuits of said first bit group decoding circuit includes unit decoders provided for the reference voltages representable by digital data having the most significant bit different in value and the remaining bits same in value.

6. The decoding circuit according to claim 1, wherein
   each of the sub-decoding circuits in each of said bit group decoding circuits includes a unit decoder having M switching elements connected in series with a corresponding bit group having M bits and selectively made conductive in accordance with values of corresponding bits, with said M being an integer not smaller than one, and
   each of said sub-decoding circuits, in accordance with bit a value of a corresponding bit group, selects one output candidate from M-th power of 2 output candidates each having the unit decoder provided correspondingly, and outputs the selected one output candidate as an output candidate to be selected in the sub-decoding circuit of the bit group decoding circuit at a subsequent stage.

7. The decoding circuit according to claim 6, wherein
   said output candidates are the reference voltages each having a magnitude representable by said multibit digital data,
   said first bit group is composed of one bit, and each of said switching elements is composed of a CMOS transmission gate, wherein said decoding circuit further comprises:

a plurality of reference voltage lines disposed extending along said second direction, for transmitting the respective reference voltages;

a plurality of control signal lines arranged extending along said first direction, for transmitting a complementary signal for the respective bits of said multibit digital data to said bit group decoding circuits, and each switching element is arranged non-overlapping each of the reference voltage lines in a planar layout, and the CMOS transmission gate of the unit decoder of said first bit group decoding circuit has a gate electrode coupled to a corresponding control signal line through a branch interconnection line extending in said second direction, said branch interconnection line is so arranged having no crossing with each other.

8. The decoding circuit according to claim 7, wherein at least some branch interconnection lines provided for the unit decoders are arranged overlapping corresponding reference voltage lines in the planar layout.

9. The decoding circuit according to claim 7, wherein the control signal lines provided for the last sub-decoding circuits are disposed in a concentrated manner between an arrangement region of the sub-decoding circuits at a preceding stage and an arrangement region of said last sub-decoding circuits, and control electrodes of the switching elements of said last sub-decoding circuits are connected to corresponding control signal lines through leading out interconnection line extending in at least a part in said second direction.

10. The decoding circuit according to claim 9, wherein the reference voltage lines include a reference voltage line having a bypassing path provided avoiding a region where the switching elements of the unit decoder of a corresponding last sub-decoding circuit are arranged.

11. The decoding circuit according to claim 9, wherein the last sub-decoding circuits each have a corresponding switching element arranged in a region between corresponding reference voltage lines.

12. A display apparatus comprising:

a digital/analog converting circuit including a decoding circuit and converting display pixel data represented by multibit digital data having a plurality of bits into an analog voltage, said multibit digital data being divided into a plurality of bit groups, at least one bit group having a plurality of bits, said decoding circuit including bit group decoding circuits arranged corresponding to the respective bit groups, said bit group decoding circuits including (i) a first bit group decoding circuit provided corresponding to a first bit group having at least one bit of said multibit digital data, and decoding the bit of the first bit group for selecting and producing output candidates corresponding to a decoding result out of a plurality of output candidates arranged along a first direction, said first bit group decoding circuit including a plurality of first sub-decoding circuits, one arranged for each group of a predetermined number of output candidates, each commonly receiving the bit of said first bit group for selecting one output candidate from a corresponding group of output candidates, each of said first sub-decoding circuits including a plurality of unit decoders, each provided for a different output candidate, arranged in parallel along a second direction, and (ii) a last bit group decoding circuit provided corresponding to a last bit group of said plurality of bit groups, and commonly receiving and decoding a bit of said last bit group, said last bit group decoding circuit including a plurality of last sub-decoding circuits arranged corresponding to the respective outputs of the bit group decoding circuit at a preceding stage, and selecting a corresponding output from the outputs of the bit group decoding circuit at the preceding stage in accordance with the bit of said last bit group to transmit a selected corresponding output to an output signal line as said analog voltage;

a plurality of data lines each coupled to a plurality of display pixels; and a data line driving circuit for driving the data lines in accordance with the analog voltage outputted by said digital/analog converting circuit.

\* \* \* \* \*